United States Patent
Kim et al.

(10) Patent No.: US 9,653,294 B2
(45) Date of Patent: May 16, 2017

(54) METHODS OF FORMING FINE PATTERNS AND METHODS OF MANUFACTURING INTEGRATED CIRCUIT DEVICES USING THE METHODS

(71) Applicant: Samsung Electronics Co., Ltd., Suwon-Si, Gyeonggi-do (KR)

(72) Inventors: Eun-sung Kim, Seoul (KR); Dae-yong Kang, Suwon-si (KR); Seung-chul Kwon, Suwon-si (KR); Shi-yong Yi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/957,777

(22) Filed: Dec. 3, 2015

(65) Prior Publication Data
US 2016/0163547 A1   Jun. 9, 2016

(30) Foreign Application Priority Data

Dec. 3, 2014 (KR) .................. 10-2014-0172373

(51) Int. Cl.
| | |
|---|---|
| *H01L 21/302* | (2006.01) |
| *H01L 21/033* | (2006.01) |
| *H01L 21/308* | (2006.01) |
| *H01L 21/311* | (2006.01) |
| *H01L 21/3213* | (2006.01) |
| *H01L 27/108* | (2006.01) |

(52) U.S. Cl.
CPC ...... *H01L 21/0337* (2013.01); *H01L 21/0332* (2013.01); *H01L 21/3086* (2013.01); *H01L 21/31144* (2013.01); *H01L 21/32139* (2013.01); *H01L 27/10855* (2013.01)

(58) Field of Classification Search
CPC ............ H01L 21/0332; H01L 21/0335; H01L 21/0337; H01L 21/0338; H01L 21/308; H01L 21/31144; H01L 21/3086; H01L 21/32139; H01L 27/10855
USPC ....... 438/700, 706, 710, 714, 717, 719, 720, 438/723, 736
See application file for complete search history.

(56) References Cited

U.S. PATENT DOCUMENTS

| | | | |
|---|---|---|---|
| 7,811,940 B2 | 10/2010 | Sandhu | |
| 7,842,337 B2 | 11/2010 | Kim et al. | |
| 8,173,034 B2 | 5/2012 | Millward et al. | |
| 8,785,329 B2 | 7/2014 | Maeda et al. | |
| 8,921,030 B2 * | 12/2014 | Guillorn | B81C 1/00031 430/270.1 |
| 2012/0028476 A1 | 2/2012 | Li et al. | |
| 2012/0196089 A1 | 8/2012 | Yang et al. | |
| 2012/0263915 A1 * | 10/2012 | Millward | B81C 1/00031 428/120 |
| 2013/0236658 A1 | 9/2013 | Sato | |
| 2013/0309457 A1 | 11/2013 | Rathsack et al. | |
| 2013/0344249 A1 | 12/2013 | Minegishi et al. | |
| 2014/0148012 A1 * | 5/2014 | Guillorn | B81C 1/00031 438/700 |

(Continued)

FOREIGN PATENT DOCUMENTS

| | | |
|---|---|---|
| JP | 4673266 | 4/2011 |
| JP | 2014-090029 | 5/2014 |

*Primary Examiner* — Lan Vinh
(74) *Attorney, Agent, or Firm* — Ward and Smith, P.A.

(57) ABSTRACT

The present inventive concept provides a method of forming a fine pattern including forming a plurality of pillar-shaped guides that are regularly arranged on a feature layer.

7 Claims, 65 Drawing Sheets

B - B'

(56) References Cited

U.S. PATENT DOCUMENTS

2014/0315390 A1* 10/2014 Abdallah ............ H01L 21/3081
                                                              438/703

* cited by examiner

| $L_0$ | GUIDE CD (GUIDE PITCH $L_P$ = 107.8 nm) | | | | |
|---|---|---|---|---|---|
| | 82.9 nm | 77.0 nm | 71.9 nm | 67.4 nm | 62.2 nm |
| 53.9 nm | | | | | |
| 62.2 nm | | | | | |

PS  PMMA  PG

METHODS OF FORMING FINE PATTERNS AND METHODS OF MANUFACTURING INTEGRATED CIRCUIT DEVICES USING THE METHODS

CROSS-REFERENCE TO RELATED APPLICATION

This application claims the benefit under 35 USC §119 of Korean Patent Application No. 10-2014-0172373, filed on Dec. 3, 2014, in the Korean Intellectual Property Office, the disclosure of which is incorporated herein in its entirety by reference.

BACKGROUND

The inventive concept relates to a method of forming a fine pattern and a method of manufacturing an integrated circuit (IC) device, and more particularly, to a method of forming a fine pattern using a block copolymer and a method of manufacturing an IC device by using the method.

As the degree of integration of semiconductor devices increases, a two-dimensional area of each unit cell decreases. With a decrease in the area of a unit cell, a design rule for a nanoscale critical dimension (CD) that ranges from several to tens of nanometers (nm) is used, an opening has a nanoscale size, and a new method of forming a pattern which may improve CD uniformity may be useful.

SUMMARY

The inventive concept provides a method of forming a fine pattern which may form a plurality of hole patterns that are repeatedly formed at fine pitches in order to form a pattern that is used to manufacture a highly integrated semiconductor device exceeding a resolution limit in a photolithography process.

The inventive concept provides a method of manufacturing an integrated circuit (IC) device including a plurality of hole patterns that are repeatedly formed at fine pitches in a limited area.

According to an aspect of the inventive concept, there is provided a method of forming a fine pattern. The method forms a plurality of pillar-shaped guides that are regularly arranged on a feature layer. The method forms a major block affinity liner on exposed surfaces of the plurality of pillar-shaped guides. The method forms a block copolymer layer including a first polymer block having a first repeating unit and a second polymer block having a second repeating unit around the plurality of pillar-shaped guides on the feature layer. The method phase separates the block copolymer layer and forms a plurality of first domains that includes the first polymer block and are regularly arranged along with the plurality of pillar-shaped guides and a second domain that includes the second polymer block, contacts the major block affinity liner, and surrounds the plurality of pillar-shaped guides and the plurality of first domains. The method removes the plurality of first domains. The method forms a plurality of holes in the feature layer by etching the feature layer by using the plurality of pillar-shaped guides and the second domain as etch masks.

The major block affinity liner may include a polymer having a same repeating unit as that of the second polymer block.

The phase separation of the block copolymer layer may include: self-assembling the plurality of first domains so as to be spaced apart from the plurality of pillar-shaped guides with the major block affinity liner and the second domain therebetween.

Forming the major block affinity liner includes coating a polymer composition including a polymer having the second repeating unit on surfaces of the plurality of pillar-shaped guides; attaching the polymer having the second repeating unit to the surfaces of the plurality of pillar-shaped guides by heat-treating the polymer composition coated on the surfaces of the plurality of pillar-shaped guides; and removing a non-reacted portion of the polymer composition to expose the major block affinity liner that covers the surfaces of the plurality of pillar-shaped guides. Removing the non-reacted portion of the polymer composition may include: using an organic solvent to remove the non-reacted portion of the polymer composition.

The major block affinity liner may be formed to have a thickness that ranges from about 2 nm to about 15 nm.

Forming the major block affinity liner may include coating a polymer composition including a random copolymer including a polymer having the second repeating unit and an anchoring polymer having a repeating unit including a primary hydroxyl group on surfaces of the plurality of pillar-shaped guides; and attaching the polymer to the surfaces of the plurality of pillar-shaped guides by using the primary hydroxyl group included in the anchoring polymer as an anchoring group by heat-treating the polymer composition coated on the surfaces of the plurality of pillar-shaped guides. The anchoring polymer may be included in an amount that ranges from about 0.01 weight % to about 10 weight % based on a total weight of the random copolymer.

The plurality of pillar-shaped guides may be formed of a silicon containing material.

The method may further include: after the forming of the major block affinity liner, and before the forming of the block copolymer layer, forming a neutral liner on a local region of the feature layer between the plurality of pillar-shaped guides.

Forming the neutral liner may include: coating a polymer composition including a random copolymer including a first polymer having the first repeating unit and a second polymer having the second repeating unit on the local region of the feature layer; attaching the random copolymer to the local region of the feature layer by heat-treating the polymer composition coated on the local region of the feature layer; and removing a non-reacted portion of the polymer composition to expose the neutral liner that covers the local region of the feature layer.

The neutral liner may be formed to have a thickness that ranges from about 2 nm to about 15 nm.

Forming the neutral liner may include: coating a polymer composition including a random copolymer including a first polymer having the first repeating unit, a second polymer having the second repeating unit, and an anchoring polymer having a repeating unit including a primary hydroxyl group on the local region of the feature layer; and attaching the random copolymer to the local region of the feature layer by using the primary hydroxyl group included in the anchoring polymer as an anchoring group by heat-treating the polymer composition coated on the local region of the feature layer. The anchoring polymer may be included in an amount that ranges from about 0.01 weight % to about 10 weight % based on a total weight of the random copolymer.

Forming the plurality of pillar-shaped guides may include: forming the plurality of pillar-shaped guides to have a thickness that is about 0.5 times to about 1.5 times a bulk period of the block copolymer layer, wherein the bulk period of the block copolymer layer ranges from about 40 to about 60 nm.

Forming the plurality of pillar-shaped guides may include forming the plurality of pillar-shaped guides to be arranged in a hexagonal array having a first pitch that is at least 1.5 times a bulk period of the block copolymer layer, wherein the bulk period of the block copolymer layer ranges from about 40 to about 60 nm.

Forming the plurality of pillar-shaped guides may include forming the plurality of pillar-shaped guides to have a first pitch that is N times (where N is an integer equal to or greater than 2) a bulk period of the block copolymer layer, wherein the bulk period of the block copolymer layer ranges from about 40 nm to about 60 nm.

Forming of the plurality of pillar-shaped guides may include forming the plurality of pillar-shaped guides to be regularly arranged to have a first pitch, wherein the phase separating of the block copolymer layer includes phase separating the block copolymer layer so that the plurality of first domains are arranged in a cylindrical shape at a central portion between two or three pillar-shaped guides from among the plurality of pillar-shaped guides and the plurality of pillar-shaped guides and the plurality of first domains are regularly arranged to have a second pitch that is less than the first pitch.

A volume ratio between the first polymer block and the second polymer block in the block copolymer layer may range from about 20:80 to about 40:60.

The first polymer block may be poly (methyl methacrylate) (PMMA), poly (ethylene oxide) (PEO), poly (lactic acid) (PLA), or polyisoprene (PI), and the second polymer block is polystyrene (PS).

According to another aspect of the inventive concept, there is provided a method of forming a fine pattern. The method includes forming a feature layer on a substrate. The method includes forming in the feature layer a plurality of first holes that are regularly arranged to have a first pitch. The method further includes forming a plurality of pillar-shaped guides that fill the plurality of first holes and protrude upward beyond the feature layer. The method further includes forming a major block affinity liner covering a side wall of each of the plurality of pillar-shaped guides. The method also includes forming a neutral liner on a local region of the feature layer disposed between the plurality of pillar-shaped guides. The method further includes forming a block copolymer layer including a first polymer block having a first repeating unit and a second polymer block having a second repeating unit around the plurality of pillar-shaped guides on the neutral liner. The method phase separates the block copolymer layer and forms a plurality of first domains that includes the first polymer block, disposed in a first location spaced apart from the major block affinity liner on the neutral liner, and are regularly arranged along with the plurality of pillar-shaped guides and a second domain that includes the second polymer block and surrounds the plurality of pillar-shaped guides and the plurality of first domains. The method also involves removal of the plurality of first domains. The method further forms a plurality of second holes in the feature layer by etching the neutral liner and the feature layer by using the plurality of pillar-shaped guides and the second domain as etch masks.

The major block affinity liner may include a polymer having the second repeating unit as a main component, wherein the neutral liner includes a random copolymer as a main component, the random copolymer including a first polymer having the first repeating unit and a second polymer having the second repeating unit.

The major block affinity liner may include polystyrene (PS), and the neutral liner includes a random copolymer of PS and one selected from poly (methyl methacrylate) (PMMA), poly (ethylene oxide) (PEO), poly (lactic acid) (PLA), and polyisoprene (PI).

Forming the major block affinity liner may include: forming a neutral blanket liner extending to cover exposed surfaces of the plurality of pillar-shaped guides and the local region of the feature layer and including a material having a higher affinity for the second polymer block than for the first polymer block; and exposing the local region of the feature layer by removing a part of the neutral blanket liner.

Forming the neutral liner may include: contacting a polymer composition including a random copolymer including a first polymer having the first repeating unit and a second polymer having the second repeating unit to exposed surfaces of the neutral blanket liner and the local region of the feature layer; and attaching the random copolymer selectively to only an exposed surface of the local region of the feature layer among an exposed surface of the neutral blanket liner and the exposed surface of the local region of the feature layer by heat-treating the polymer composition.

Forming the plurality of pillar-shaped guides may include: before the forming of the plurality of first holes in the feature layer, forming on the feature layer a plurality of pillar-shaped guide outer walls that define inner spaces through which the feature layer is exposed and have widths greater than widths of the plurality of first holes; and after the forming of the plurality of first holes in the feature layer, forming a plurality of pillar cores including lower portions that fill the plurality of first holes and extending portions that fill the inner spaces and protrude upward beyond the feature layer.

Forming the plurality of first holes may include forming the plurality of first holes so that the plurality of first holes are arranged in a hexagonal array to have a first pitch that is at least 1.5 times a bulk period of the block copolymer layer, wherein the bulk period of the block copolymer layer ranges from about 40 nm to about 60 nm.

Forming the plurality of first holes may include forming the plurality of first holes so that the plurality of first holes are arranged to have a first pitch that is N times (where N is an integer equal to or greater than 2) a bulk period of the block copolymer layer, wherein the bulk period of the block copolymer layer ranges from about 40 nm to about 60 nm.

Forming the plurality of first holes may include forming the plurality of first holes so that the plurality of first holes are regularly arranged to have a first pitch, and the phase separating of the block copolymer layer includes phase separating the block copolymer layer so that the plurality of first domains are arranged in a cylindrical shape at a central portion between two or three first holes that are adjacent to each other from among the plurality of first holes, and the plurality of first holes and the plurality of first domains are regularly arranged to have a second pitch that is less than the first pitch.

The feature layer and the plurality of pillar-shaped guides may be formed of silicon containing materials having different compositions.

A further aspect of the inventive concept relates to a method of forming a fine pattern, the method comprising forming a plurality of pillar-shaped guides comprising a silicon containing material and are regularly arranged on a layer on a substrate; forming a block affinity liner on exposed surfaces of the plurality of pillar-shaped guides;

forming a block copolymer layer comprising a first polymer block comprising at least one of poly (methyl methacrylate) (PMMA), poly (ethylene oxide) (PEO), poly (lactic acid) (PLA), or polyisoprene (PI) and a second polymer block comprising polystyrene (PS) around the plurality of pillar-shaped guides on the layer; phase separating the block copolymer layer and forming a plurality of first domains that comprise the first polymer block and are regularly arranged along with the Plurality of pillar-shaped guides and a second domain that comprises the second polymer block to, contact the block affinity liner, surrounding the plurality of pillar-shaped guides and the plurality of first domains; removing the plurality of first domains; and forming a plurality of holes in the layer by etching the layer using the plurality of pillar-shaped guides and the second domain as etch masks. The method further comprises coating the first and/or second polymer block. The method may further comprise heat treating the coated first and/or second polymer block.

According to another aspect of the inventive concept, there is provided a method of manufacturing an integrated circuit (IC) device. The method includes forming an etched film on a substrate. The method further includes forming a first mask layer on the etched film. The method also includes forming a second mask layer on the first mask film. The method further includes forming a second mask pattern in which a plurality of regularly arranged openings are formed by patterning the second mask layer. The method also includes forming a first mask pattern in which a plurality of regularly arranged first holes are formed by etching the first mask layer by using the second mask pattern as an etch mask. The method further includes forming a plurality of pillar-shaped guides that fill the plurality of first holes and protrude upward beyond the first mask pattern. The method also includes removal of the second mask pattern to expose a top surface of the first mask pattern. The method further includes forming a major block affinity liner covering a side wall of each of the plurality of pillar-shaped guides. The method includes forming a neutral liner covering the top surface of the first mask pattern between the plurality of pillar-shaped guides. The method also includes forming a block copolymer layer including a first polymer block and a second polymer block within a region limited by the major block affinity liner on the neutral liner. The method phase separates the block copolymer layer and forms a plurality of first domains regularly arranged in a location spaced apart from the plurality of pillar-shaped guides on the neutral liner and a second domain surrounding the plurality of pillar-shaped guides and the plurality of first domains on the neutral liner. The method also includes removal of the plurality of first domains. The method also forms a plurality of second holes in the first mask pattern by etching the first mask pattern by using the plurality of pillar-shaped guides and the second domain as etch masks. The method further forms a fine pattern by etching the etched film by using the first mask pattern in which the plurality of first holes and the plurality of second holes are formed as an etch mask.

A bulk period of the block copolymer layer may range from about 40 nm to about 60 nm, wherein forming the plurality of first holes includes forming the plurality of first holes so that the plurality of first holes are arranged in a hexagonal array to have a first pitch that is at least 1.5 times the bulk period of the block copolymer layer, and forming the fine pattern includes forming in the etched film a plurality of holes that are arranged in a hexagonal array to have a second pitch that is less than the first pitch by etching the etched film.

The major block affinity liner may include a polystyrene (PS) layer, and the neutral liner includes a random copolymer layer including random copolymer of PS and one selected from poly (methyl methacrylate) (PMMA), poly (ethylene oxide) (PEO), poly (lactic acid) (PLA), and polyisoprene (PI).

BRIEF DESCRIPTION OF THE DRAWINGS

Exemplary embodiments of the inventive concept will be more clearly understood from the following detailed description taken in conjunction with the accompanying drawings in which:

FIGS. 1A and 1B through FIGS. 13A and 13B are views for sequentially explaining a method of forming a fine pattern, according to an exemplary embodiment, wherein FIGS. 1A, 2A, . . . , and 13A are plan views for explaining the method and FIGS. 1B, 2B, . . . , and 13B are cross-sectional views taken along lines B-B' of FIGS. 1A, 2A, . . . , and 13A, respectively;

FIGS. 16A and 16B are views for explaining a method of forming a fine pattern, according to another exemplary embodiment, wherein FIG. 16A is a plan view for explaining the method and FIG. 16B is a cross-sectional view taken along line B-B' of FIG. 16A;

FIGS. 17A and 17B are views for explaining a method of forming a fine pattern, according to another exemplary embodiment, wherein FIG. 17A is a plan view for explaining the method and FIG. 17B is a cross-sectional view taken along line B-B' of FIG. 17A;

FIG. 21 is a table showing a result of evaluating a phase separation characteristic of a pure block copolymer by variously changing a critical dimension (CD) of a plurality of pillar-shaped guides and a bulk period of the pure block copolymer when a fine pattern is formed on a substrate according to a method of forming a fine pattern according to an exemplary embodiment;

DETAILED DESCRIPTION OF THE EMBODIMENTS

Figure 1A:
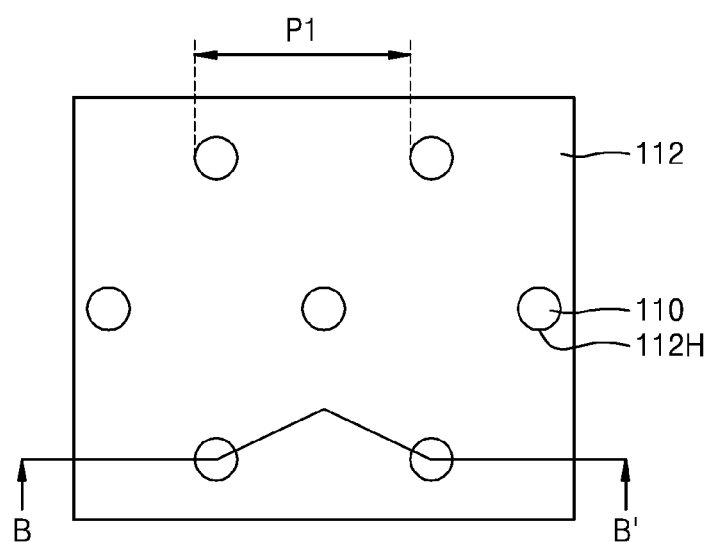

The inventive concept will now be described more fully with reference to the accompanying drawings, in which exemplary embodiments of the inventive concept are shown. In the drawings, the same elements are denoted by the same reference numerals and a repeated explanation thereof will not be given.

Hereinafter, the inventive concept will be described more fully with reference to the accompanying drawings, in which exemplary embodiments of the inventive concept are shown. The inventive concept may, however, be embodied in many different forms and should not be construed as being limited to the exemplary embodiments set forth herein; rather these embodiments are provided so that this disclosure will be thorough and complete, and will fully convey the concept of the inventive concept to one of ordinary skill in the art.

It will be understood that, although the terms first, second, third etc. may be used herein to describe various members, regions, layers, parts, and/or elements, these members, regions, layers, parts, and/or elements should not be limited by these terms. These terms are only used to distinguish one member, region, layer, part, or element from another member, region, layer, part, or element. Thus, a first member, region, part, or element discussed below could be termed a second member, region, part, or element without departing from the teachings of exemplary embodiments. For example, a first element may be referred to as a second element, and likewise, a second element may be referred to as a first element without departing from the scope of the inventive concept.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein by the inventive concept.

A specific process order may be changed in another embodiment. For example, two processes which are described as being continuously performed may be simultaneously performed or may be performed in a reverse order.

As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Figure 1B:
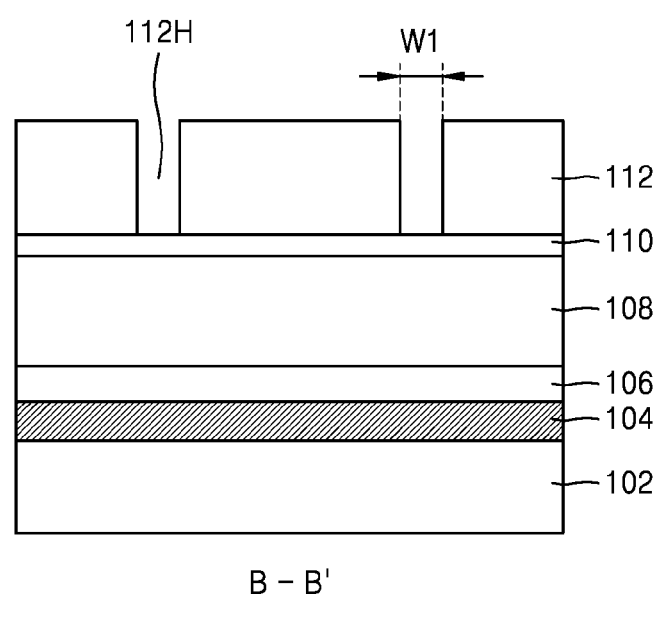
Figure 2A:
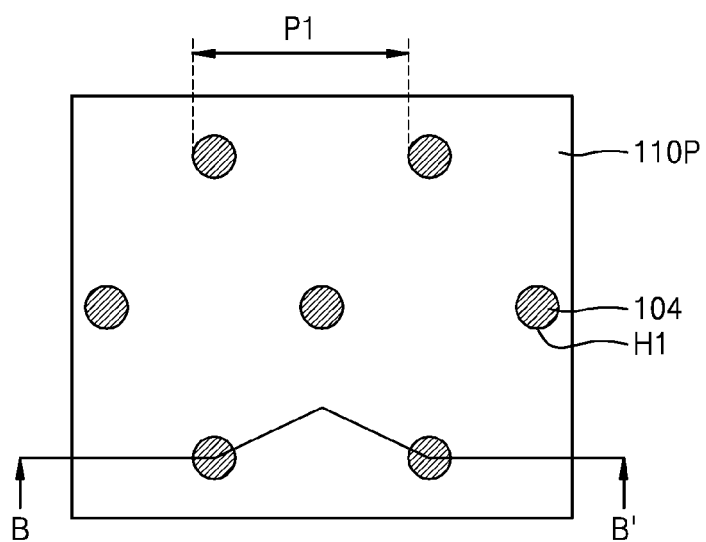
Figure 2B:
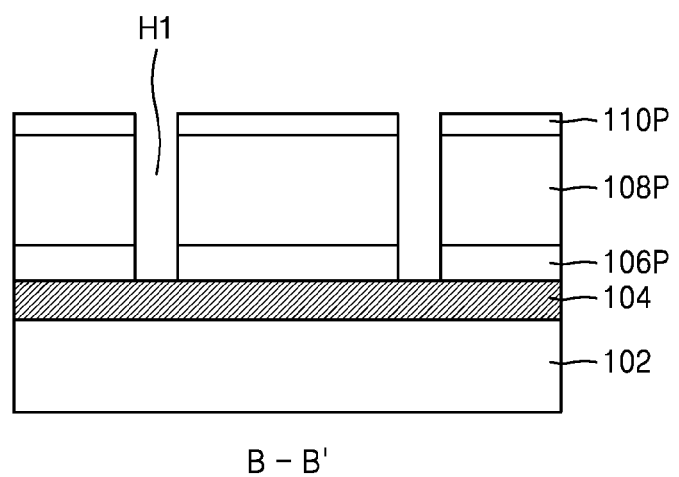

FIGS. 1A and 1B through FIGS. 13A and 13B are views for sequentially explaining a method of forming a fine pattern, according to an exemplary embodiment, wherein FIGS. 1A, 2A, . . . , and 13A are plan views for explaining the method and FIGS. 1B, 2B, . . . , and 13B are cross-sectional views taken along lines B-B' of FIGS. 1A, 2A, . . . , and 13A.

Referring to FIGS. 1A and 1B, an etched film 104 is formed on a substrate 102, and a first mask layer 106 and a second mask layer 108 are sequentially formed on the etched film 104.

The substrate 102 may be a semiconductor substrate. In some exemplary embodiments, the substrate 102 may be formed of a semiconductor material such as silicon (Si) or germanium (Ge). In other exemplary embodiments, the substrate 102 may include a semiconductor material such as SiGe, SiC, GaAs, InAs, or InP. In other exemplary embodiments, the substrate 102 may have a silicon on insulator (SOI) structure. The substrate 102 may include a conductive region, for example, a well doped with impurities or a structure doped with impurities. Also, the substrate 102 may have any of various device isolation structures such as a shallow trench isolation (STI) structure as understood by one of ordinary skill in the art.

The etched film 104 may be an insulating film or a conductive film. For example, the etched film 104 may be formed of, but is not limited to, a metal, an alloy, metal carbide, metal nitride, metal oxynitride, metal oxycarbide, semiconductor, polysilicon, oxide, nitride, oxynitride, hydrocarbon, or a combination thereof. When a pattern that is to be finally formed is formed on the substrate 102, the etched film 104 may be omitted.

The first mask layer 106 may be used as a feature layer for forming a final pattern to be formed on the etched film 104 and transferring the final pattern to the etched film 104. In some exemplary embodiments, the first mask layer 106 may have a hydrophilic surface. In some exemplary embodiments, a silanol group may be exposed through a surface of the first mask layer 106.

In some exemplary embodiments, the first mask layer 106 may be formed of a material including Si. For example, the first mask layer 106 may be formed of, but is not limited to, a silicon nitride film, a silicon oxide film, a silicon oxynitride film, a silicon carbonitride film, or a combination thereof. The first mask layer 106 may be formed to have a thickness ranging from, but is not limited to, about 100 Å to about 500 Å.

The second mask layer 108 may be formed of a material different from that of the first mask layer 106. For example, when the first mask layer 106 is formed of a silicon nitride film, a silicon oxynitride film, and/or a silicon carbonitride film, the second mask layer 108 may be formed of a carbon-containing film such as a spin-on hardmask (SOH) material, a silicon oxide film, or a combination thereof. The carbon-containing film such as a SOH material may include an organic compound having a relatively high carbon content ranging from about 85 weight % to about 99 weight % based on a total weight. The organic compound may include a hydrocarbon compound including an aromatic ring such as phenyl, benzene, or naphthalene, or a derivative thereof. The second mask layer 108 may be formed to have a thickness ranging from, but is not limited to, about 500 Å to about 3000 Å.

An anti-reflection film 110 is formed on the second mask layer 108, and a third mask pattern 112 in which a plurality of holes 112H are formed is formed on the anti-reflection film 110.

The anti-reflection film 110 may be any film as long as it is used for a typical photolithography process. In some exemplary embodiments, the anti-reflection film 110 may be formed of a material including Si. In some exemplary embodiments, the anti-reflection film 110 may be a silicon oxynitride film. In other exemplary embodiments, the anti-reflection film 110 may be formed of an organic anti-reflective coating (ARC) material for a KrF excimer laser, an ArF excimer laser, or other light sources.

The anti-reflection film 110 may be formed to have a thickness ranging from, but is not limited to, about 20 nm to about 500 nm.

A width or a critical dimension (CD) of each of pillar-shaped guides PG1 that will be explained with reference to FIGS. 3A and 3B in a subsequent process may be determined by a width W1 of each of the plurality of holes 112H formed in the third mask pattern 112. The plurality of holes 112H formed in the third mask pattern 112 may be regularly arranged. For example, the plurality of holes 112H may be arranged in a hexagonal array or a matrix array.

The third mask pattern 112 may be formed of a photoresist. In some exemplary embodiments, the third mask pattern 112 may be formed of a resist for a KrF excimer laser (with wavelengths of 248 mm), a resist for an ArF excimer laser (with wavelengths of 193 nm), a resist for a $F_2$ excimer laser (with wavelengths of 157 nm), or a resist for an extreme ultraviolet (EUV) (with wavelengths of 13.5 nm).

Referring to FIGS. 2A and 2B, a second mask pattern 108P and an anti-reflection pattern 110P are formed by etching the anti-reflection film 110 and the second mask layer 108 by using the third mask pattern 112 (see FIGS. 1A and 1B) as an etch mask, and a first mask pattern 106P is formed by etching the first mask layer 106 by using the second mask pattern 108P as an etch mask. As a result, a plurality of guide forming holes H1 that pass through the first mask pattern 106P and the second mask pattern 108P are formed.

The plurality of guide forming holes H1 may be regularly formed. For example, the plurality of guide forming holes H1 may be formed to be arranged in a hexagonal array or a matrix array.

After the plurality of guide forming holes H1 are formed, a top surface of the anti-reflection pattern 110P may be exposed by removing unnecessary films.

Figure 3A:
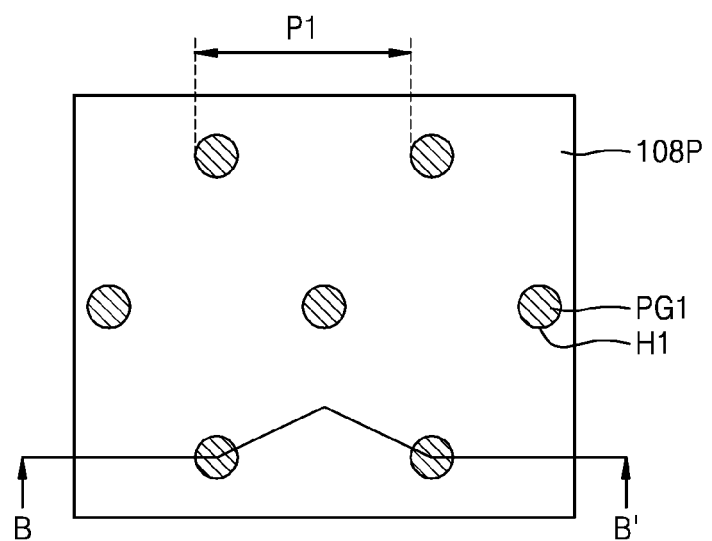
Figure 3B:
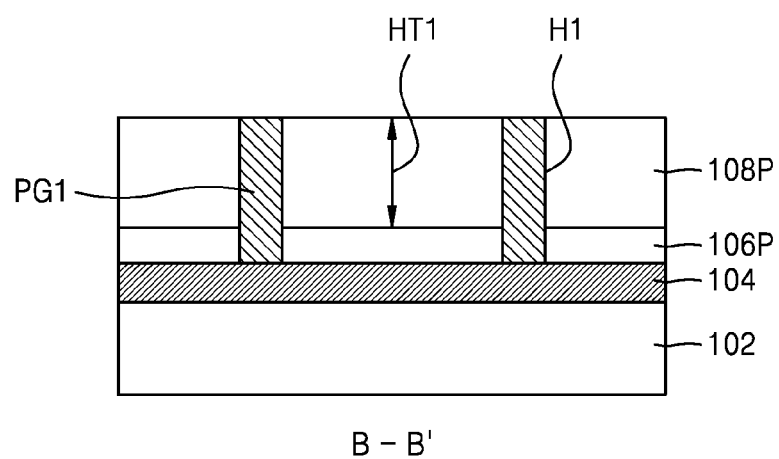

Referring to FIGS. 3A and 3B, the plurality of pillar-shaped guides PG1 are formed in the plurality of guide forming holes H1.

In some exemplary embodiments, in order to form the plurality of pillar-shaped guides PG1, a guide-forming material may be deposited to cover the top surface of the anti-reflection pattern and to fill the plurality of guide forming holes H1, and an unnecessary portion of the deposited guide-forming material may be removed by using an etch-back process or a polishing process to make the deposited guide-forming material remain only in the plurality of guide forming holes H1. Since the anti-reflection pattern 110P may also be removed while the unnecessary portion of the guide-forming material is removed, a top surface of the second mask pattern 108P may be exposed around the plurality of pillar-shaped guides PG1.

The plurality of pillar-shaped guides PG1 protrude upward beyond the first mask pattern 106P. A height HT1 of each of portions of the plurality of pillar-shaped guides PG1 that protrude upward beyond the first mask pattern 106P may range from, but is not limited to, about 10 nm to about 500 nm.

The plurality of pillar-shaped guides PG1 may be formed of a material including Si. In some exemplary embodiments, the plurality of pillar-shaped guides PG1 may be formed of silicon oxide. In some exemplary embodiments, in order to form the plurality of pillar-shaped guides PG1, an atomic layer deposition (ALD) or chemical vapour deposition (CVD) process may be performed on the guide-forming material.

In some exemplary embodiments, the plurality of pillar-shaped guides PG1 may be formed to have a diameter that is about 0.5 times to about 1.5 times a bulk period $L_0$ of a block copolymer layer 120 that will be explained with reference to FIGS. 8A and 8B. To this end, the width W1 of each of the plurality of holes 112H formed in the first mask pattern 112 of FIGS. 1A and 1B and a width of each of the plurality of guide forming holes H1 of FIGS. 2A and 2B may be adjusted. The bulk period $L_0$ will be described in detail with reference to FIG. 14 later.

Figure 8A:
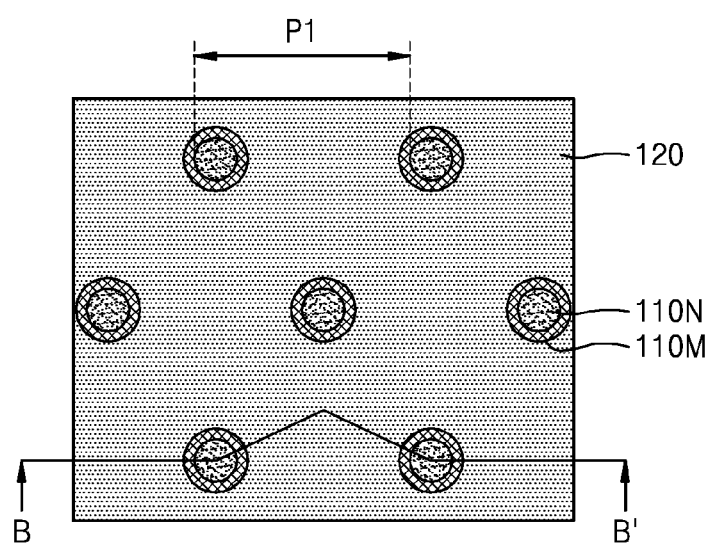
Figure 8B:
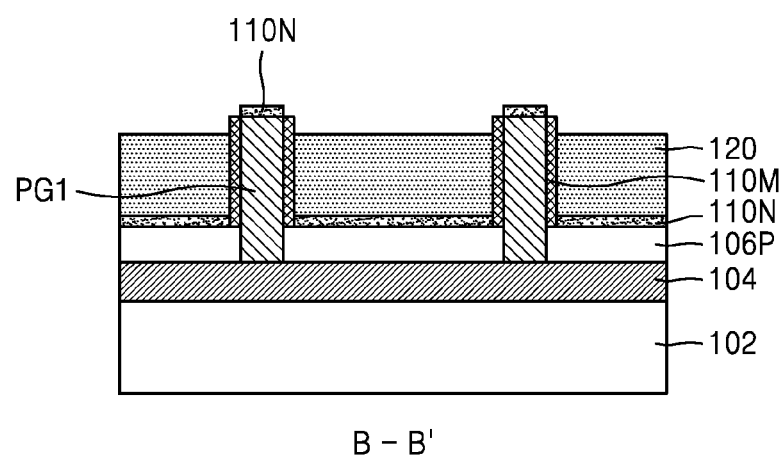

The plurality of pillar-shaped guides PG1 may be formed to have a first pitch P1 that is at least 1.5 times the bulk period $L_0$ of the block copolymer layer 120 of FIGS. 8A and 8B. To this end, the plurality of pillar-shaped guides PG1 may be formed so that a pitch of the plurality of holes 112H formed in the first mask pattern of FIGS. 1A and 1B and a pitch of the plurality of guide forming holes H1 of FIGS. 2A and 2B are each at least 1.5 times the bulk period $L_0$ of the block copolymer layer 120.

The plurality of pillar-shaped guides PG1 may be formed to be arranged in a hexagonal array having the first pitch P1 that is at least 1.5 times the bulk period $L_0$ of the block copolymer layer 120.

In some exemplary embodiments, the plurality of pillar-shaped guides PG1 may be formed to be arranged in a hexagonal array having the first pitch P1 that is 1.73 times the bulk period $L_0$ of the block copolymer layer 120. In this case, as will be described with reference to FIGS. 9A and 9B, a plurality of first domains 120A that are formed due to a phase separation process of the block copolymer layer 120 may be self-aligned in a cylindrical shape at a central portion between three pillar-shaped guides PG1 that are adjacent to one another from among the plurality of pillar-shaped guides PG1.

Figure 16A:
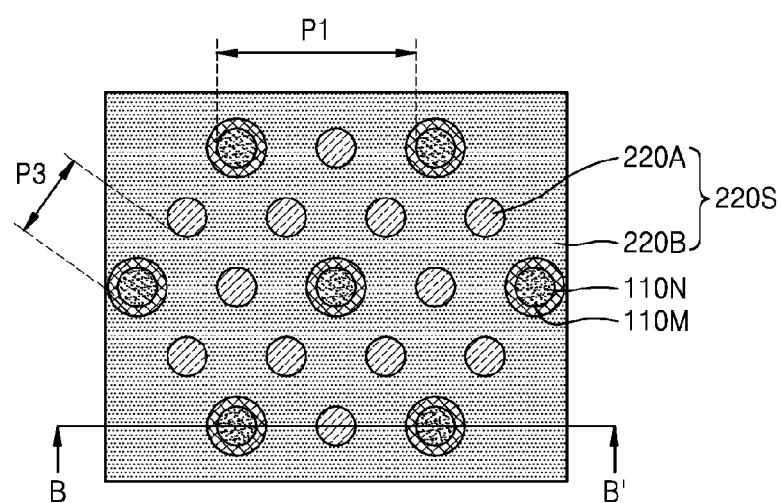

In other exemplary embodiments, the plurality of pillar-shaped guides PG1 may be formed to be arranged in a hexagonal array having the first pitch P1 that is N times (N is an integer equal to or greater than 2) the bulk period $L_0$ of the block copolymer layer 120. For example, the plurality of pillar-shaped guides PG1 may have the first pitch P1 that is 2 times the bulk period $L_0$ of the block copolymer layer 120. In this case, as shown in FIGS. 16A and 17B, a plurality of first domains 220A that are formed due to a phase separation process of the block copolymer layer 120 may be self-aligned in a cylindrical shape at a central portion between two pillar-shaped guides PG1 that are adjacent to each other from among the plurality of pillar-shaped guides PG1.

Figure 4A:
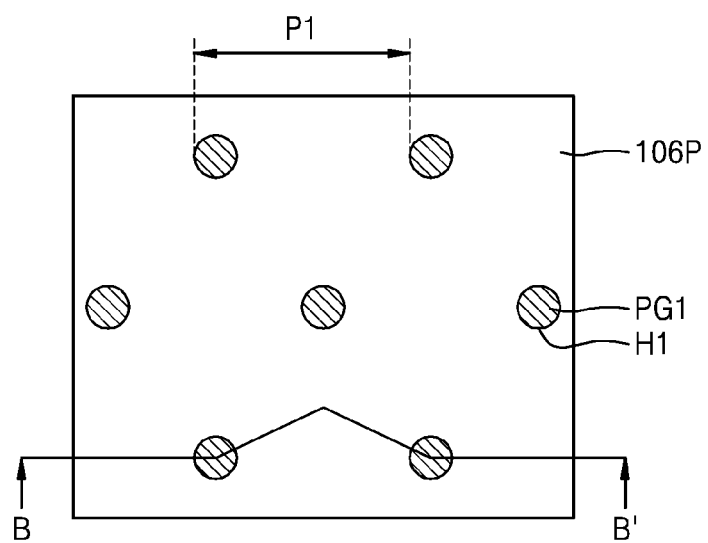
Figure 4B:
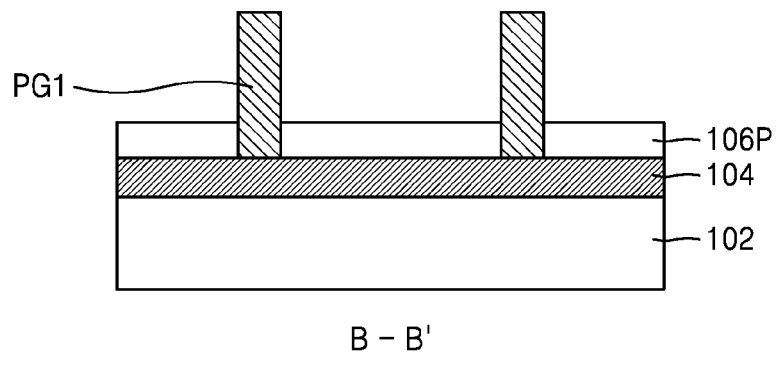

Referring to FIGS. 4A and 4B, a top surface of the first mask pattern 106P and top surfaces and side walls of the plurality of pillar-shaped guides PG1 are exposed by removing the second mask pattern 108P (see FIGS. 3A and 3B).

In some exemplary embodiments, when the second mask pattern 108P is formed of an SOH material, an ashing or stripping process may be used in order to remove the second mask pattern 108P.

Figure 5A:
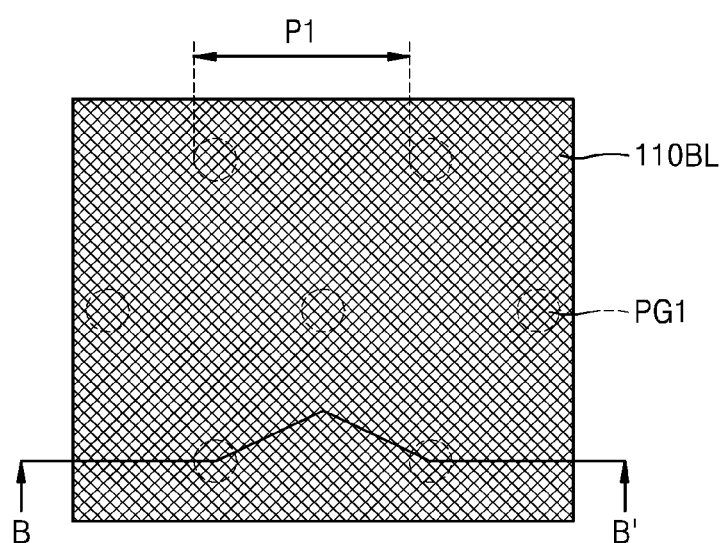
Figure 5B:
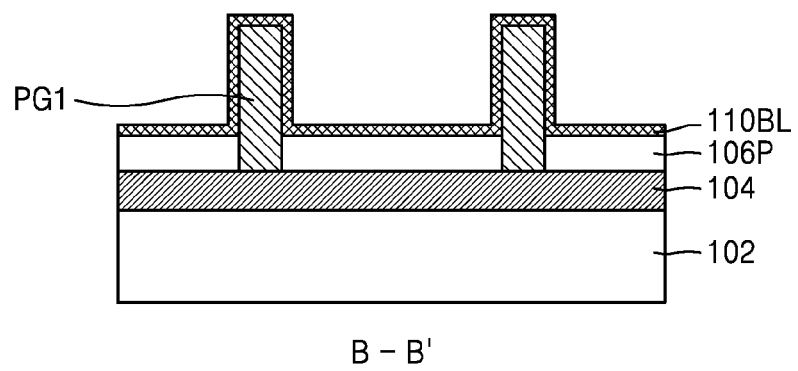

Referring to FIGS. 5A and 5B, a blanket liner 110BL that covers an exposed surface of the first mask pattern 106P and exposed top surfaces and side walls of the plurality of pillar-shaped guides PG1 is formed.

In some exemplary embodiments, the blanket liner 110BL may include a material having a higher affinity for a second polymer block PB2 than for a first polymer block PB1 from among materials forming a block copolymer layer 120 that will be described with reference to FIGS. 8A, 8B, 14 and 15 later.

In some exemplary embodiments, the blanket liner 110BL may include polymer having the same repeating unit as a repeating unit constituting the second polymer block PB2.

In some exemplary embodiments, the blanket liner 110BL may include a random copolymer including the polymer having the same repeating unit as the repeating unit constituting the second polymer block PB2 and anchoring polymer having a repeating unit including a primary hydroxyl group. The anchoring polymer may be obtained from a monomer unit such as 2-hydroxyethyl methacrylate, 3-hydroxypropyl methacrylate, or 4-hydroxybutyl methacrylate. In the random copolymer, the anchoring polymer may be included in an amount that ranges from about 0.01 weight % to about 10 weight % based on a total weight of the random copolymer.

In some exemplary embodiments, in order to form the blanket liner 110BL, a process of attaching the random copolymer to the exposed surfaces of the plurality of pillar-shaped guides PG1 and the exposed surface of the first mask pattern 106P may be performed by using the primary hydroxyl group of the anchoring polymer as an anchoring group.

In some exemplary embodiments, in order to form the blanket liner 110BL, a polymer composition including the random copolymer may be coated on the exposed surfaces of the plurality of pillar-shaped guides PG1. Thereafter, the primary hydroxyl group of the anchoring polymer and a pillar core may be helped to react with each other by heat-treating the copolymer composition coated on the exposed surfaces of the plurality of pillar-shaped guides PG1 and the exposed surface of the first mask pattern 106P so that the random copolymer is attached to the exposed surfaces of the plurality of pillar-shaped guides PG1 and the exposed surface of the first mask pattern 106P. The heat treatment may be performed, but is not limited to, for about 60 seconds to about 300 seconds at a temperature ranging from about 150° C. to about 300° C. Thereafter, a non-reacted portion of the random copolymer composition may be removed by using an organic solvent to expose the blanket liner 110BL that covers the exposed surfaces of the plurality of pillar-shaped guides PG1 and the exposed surface of the first mask pattern 106P. The organic solvent may be, but is not limited to, propylene glycol monomethyl ester acetate (PGMEA), propylene glycol monomethyl ester (PGME), ethyl-3-ethoxy propionate (EEP), ethyl lactate (EL), methyl 2-hydroxybutyate (HBM), or gamma-butyro lactone (GBL).

Since the random copolymer includes the anchoring polymer having the primary hydroxyl group, assuming that the plurality of pillar-shaped guides PG1 are formed of a silicon oxide film, when the random copolymer are coated on the surfaces of the plurality of pillar-shaped guides PG1 and then are heat-treated, the random copolymer including the anchoring polymer may be attached to surfaces of the plurality of pillar-shaped guides PG1 due to condensation reaction between silanol of the plurality of pillar-shaped guides PG1 and the primary hydroxyl group of the anchoring polymer. When random copolymers that do not react and remain around the plurality of pillar-shaped guides PG1 are stripped by using an organic solvent to be removed, the blanket liner 110BL having a predetermined thickness may remain on the surfaces of the plurality of pillar-shaped guides PG1 and the plurality of pillar-shaped guides PG1 whose surface characteristics are changed due to the blanket liner 110BL may be obtained.

In some embodiments, the blanket liner 110BL may be formed as a polymer layer having polystyrene (PS) as a main component. In this case, the blanket liner 110BL may have PS affinity for materials forming the block copolymer layer 120, for example, poly(methyl methacrylate) (PMMA) and PS, that is formed around the plurality of pillar-shaped guides PG1 in a subsequent process described with reference to FIGS. 8A and 8B later. As such, once the blanket liner 110BL is formed to have PS affinity, after the block copolymer layer 120 is phase separated, an undesired PMMA domain may be prevented from remaining in a ring shape or a discontinuous ring shape around the plurality of pillar-shaped guides PG1.

In some exemplary embodiments, the blanket liner 110BL may be formed to have a thickness that ranges from about 2 nm to about 15 nm.

Figure 6A:
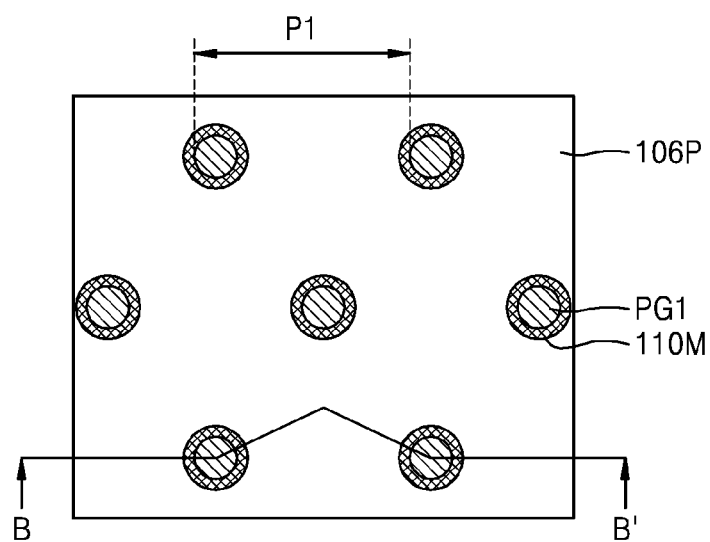
Figure 6B:
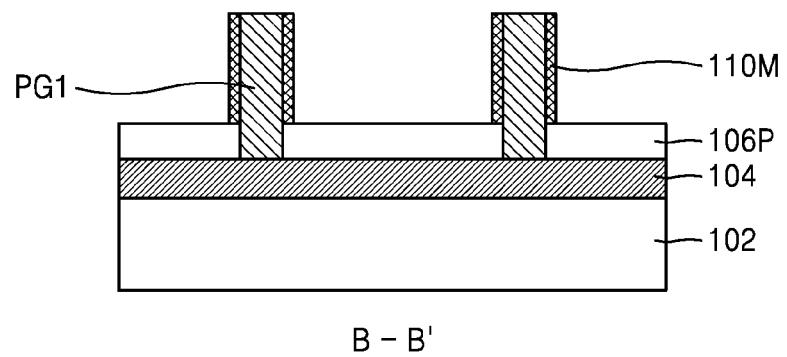

Referring to FIGS. 6A and 6B, a local region of the first mask pattern 106P is exposed by removing a part of the blanket liner 110BL.

In some embodiments, by etching back the blanket liner 110BL by using an anisotropic dry etching process, a part of the blanket liner 110BL covering side walls of plurality of pillar-shaped guides PG1 remains as a major block affinity liner 110M, and a remaining part of the blanket liner 110BL is removed, and thus a top surface of each of the plurality of pillar-shaped guides PG1 and a top surface of the first masks pattern 106P may be exposed.

In some embodiments, a plasma etching process may be used to perform the anisotropic dry etching process on the blanket liner 110BL. In some embodiments, plasma formed from gas containing an inert gas may be used during the plasma etching process. For example, $Ar/O_2$ plasma, $Ar/H_2$ plasma, Ar/CO plasma, or $Ar/Co/N_2$ plasma may be used during the plasma etching process but the exemplary embodiment is not limited thereto.

Figure 7A:
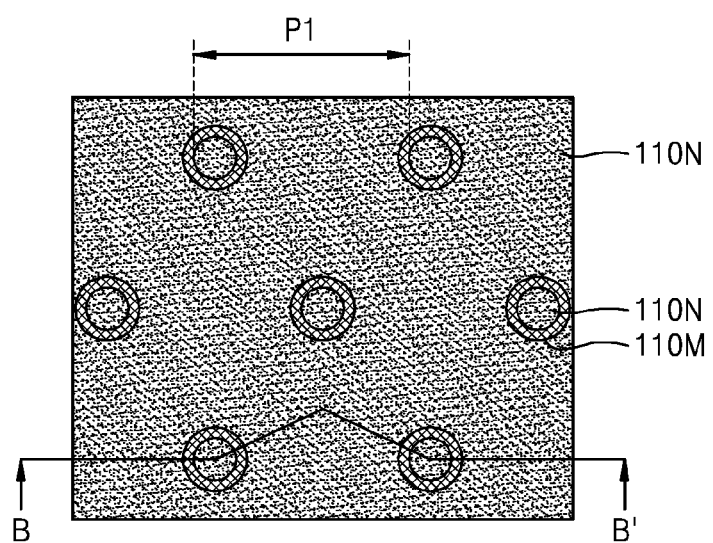
Figure 7B:
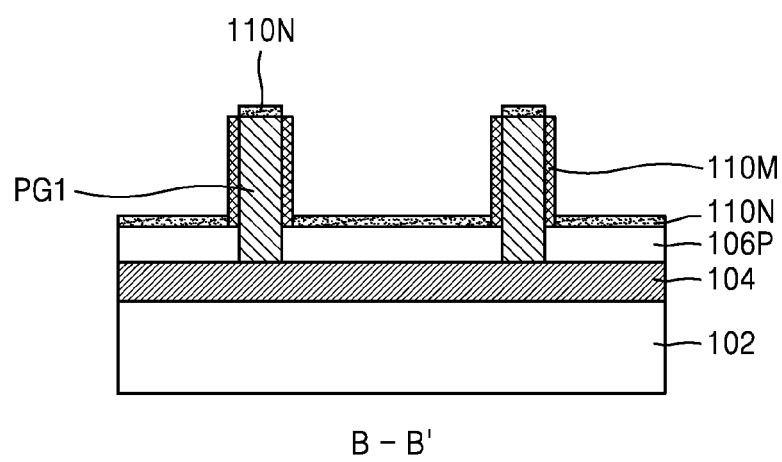

Referring to FIGS. 7A and 7B, while each of the side walls of the plurality of pillar-shaped guides PG1 is covered by the major block affinity liner 110M, a neutral liner 110N is formed on the top surface of the first mask pattern 106P exposed between the plurality of pillar-shaped guides PG1.

The neutral liner 110N may be formed of a neutral organic material whose affinity for the first polymer block PB1 and affinity for the second polymer block PB2 are generally similar, among materials forming the block copolymer layer 120 that will be described with reference to FIGS. FIGS. 8A, 8B, 14 and 15 later.

In some embodiments, the neutral liner 110N may include a first polymer having the same repeating unit as that constituting the first polymer block PB1 and second polymer having the same repeating unit as that constituting the second polymer block PB2.

In some exemplary embodiments, in order to form the neutral liner 110N, a polymer composition including the random copolymer including the first polymer having the same repeating unit as that of the first polymer block PB1 and the second polymer having the same repeating unit as that of the second polymer block PB2 may be coated on the top surface of the first mask pattern 106P, and then the coated polymer composition is heat treated, and thus the random copolymer may be attached to the top surface of the first mask pattern 106P. In this regard, the random copolymer may also be attached to the top surfaces of the plurality of pillar-shaped guides PG1 so that the neutral liner 110N may be formed. Meanwhile, since the major block affinity liner 110M is already formed on the side walls of the plurality of pillar-shaped guides PG1, the neutral liner 110N is not formed on the side walls of the plurality of pillar-shaped guides PG1. Thereafter, a non-reacted portion of the polymer composition may be removed by using an organic solvent to expose the neutral liner 110N. The organic solvent may be, but is not limited to, PGMEA, EEP, EL, HBM, GBL, etc.

In some other exemplary embodiments, the neutral liner 110N may include a random copolymer including a first polymer having the same repeating unit as the repeating unit of the first polymer block PB1, a second polymer having the same repeating unit as the repeating unit of the second polymer block PB2, and an anchoring polymer having a repeating unit including the primary hydroxyl group. The anchoring polymer may be obtained from a monomer unit such as 2-hydroxyethyl methacrylate, 3-hydroxypropyl methacrylate, or 4-hydroxybutyl methacrylate. In the random copolymer, the anchoring polymer may be included in an amount that ranges from about 0.01 weight % to about 10 weight % with respect to a total weight of the random copolymer.

In some embodiments, in order to form the neutral liner 110N, a process of attaching the random copolymer to the exposed surfaces of the plurality of pillar-shaped guides PG1 and the exposed surface of the first mask pattern 106P may be performed by using the hydroxyl group of the anchoring polymer as an anchoring group.

In some exemplary embodiments, in order to form the neutral liner 110N, a random copolymer composition including the random copolymer may be coated on an exposed surface of the first mask pattern 106P and the exposed surfaces of the plurality of pillar-shaped guides PG1. Thereafter, the hydroxyl group of the anchoring polymer may be attached to the exposed surface of the first mask pattern 106P and the exposed surfaces of the plurality of pillar-shaped guides PG1 by heat-treating the coated random copolymer composition. The heat treatment may be performed, but is not limited to, for about 60 seconds to about 300 seconds at a temperature ranging from about 150° C. to about 300° C. Thereafter, a non-reacted portion of the random copolymer composition may be removed by using an organic solvent to expose the neutral liner 110N that covers the exposed surface of the first mask pattern 106P and the exposed surfaces of the plurality of pillar-shaped guides PG1. The organic solvent may be, but is not limited to, PGMEA, PGME, EEP, EL, HBM, GBL, etc.

Since the random copolymer includes the anchoring polymer having the primary hydroxyl group, when the first mask pattern 106P is formed of a silicon containing material, for example, SiON, if the random copolymer is coated on the exposed surface of the first mask pattern 106P and then is heat-treated, the random copolymer including the anchoring polymer may be attached to a top surface of the first mask pattern 106P due to condensation reaction between silanol exposed on the top surface of the first mask pattern 106P and the hydroxyl group of the anchoring polymer. When the random copolymer composition that does not react and remains on the neutral liner 110N is stripped by using an organic solvent to be removed, the neutral liner 110N having a predetermined thickness may remain on the surface of the first mask pattern 106P, and a surface characteristic of the first mask pattern 106P may be changed to be neutral by the neutral liner 110N.

In some exemplary embodiments, the neutral liner 110N may be formed to have a thickness that ranges from about 2 nm to about 15 nm.

Referring to FIGS. 8A and 8B, the block copolymer layer 120 formed of a pure block copolymer including a first polymer block having a first repeating unit and a second polymer block having a second repeating unit is formed around the plurality of pillar-shaped guides PG1 on the first mask pattern 106P covered by the neutral liner 110N.

The block copolymer layer 120 may be spaced apart from the plurality of pillar-shaped guides PG1 with the major block affinity liner 110M therebetween.

In some embodiments, the pure block copolymer may include linear or branched polymers having a molecular weight ranging from about 3,000 g/mol to about 2,000,000 g/mol.

In the pure block copolymer, the first polymer block may be poly (methyl methacrylate) (PMMA), poly (ethylene oxide) (PEO), poly (lactic acid) (PLA), or polyisoprene (PI). The second polymer block may be polystyrene (PS).

In the block copolymer layer 120, the second polymer block may constitute a major block, and the first polymer block may constitute a minor block. In some exemplary embodiments, a volume ratio between the first polymer block and the second polymer block in the pure block copolymer may range from about 20:80 to about 40:60.

In some exemplary embodiments, in order to form the block copolymer layer 120, the pure block copolymer may be applied to the first mask pattern 106P covered by the neutral liner 110N. For example, the block copolymer layer 120 may be formed by using a dip coating, solution casting, or spin-coating process.

Figure 9A:
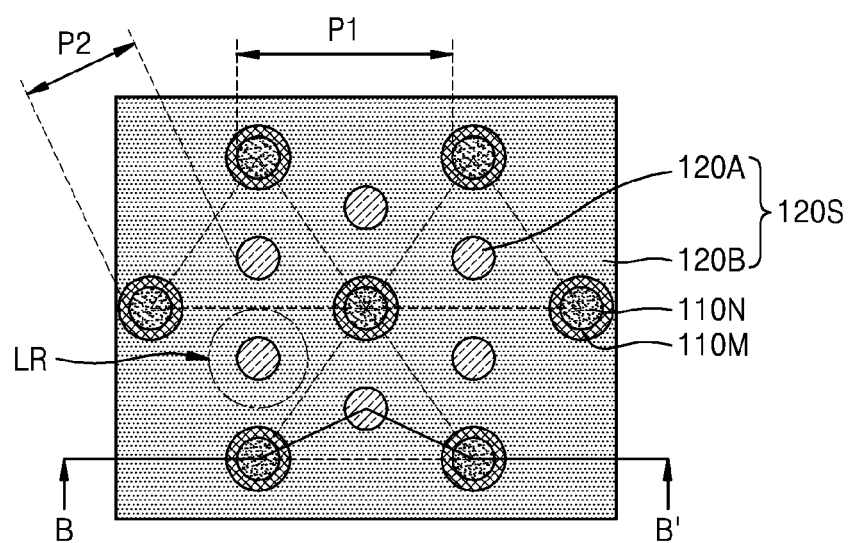
Figure 9B:
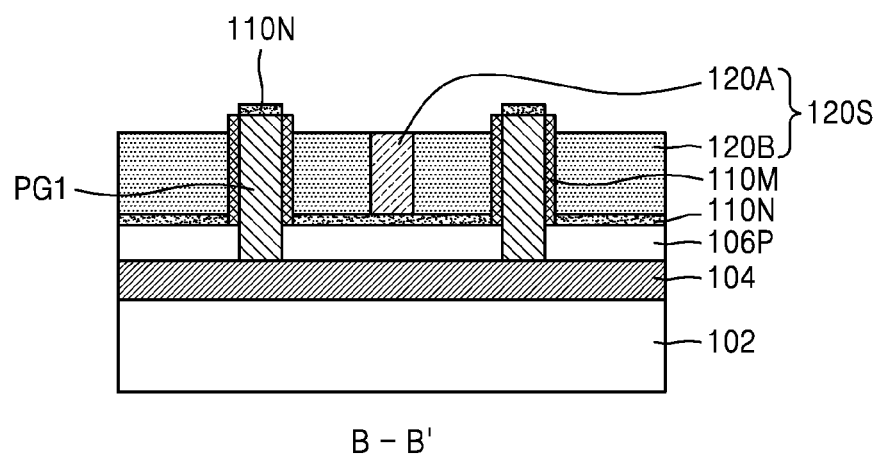

Referring to FIGS. 9A and 9B, a self-assembled layer 120S including the plurality of first domains 120A including the first polymer block and a second domain 120B that includes the second polymer block and surrounds the plurality of pillar-shaped guides PG1 and the plurality of first domains 120A is formed by phase separating the block copolymer layer 120 (see FIGS. 8A and 8B).

In order to phase separate the block copolymer layer 120, the block copolymer layer 120 may be annealed at a temperature higher than a glass transition temperature Tg of a block copolymer in the block copolymer layer 120. For example, in order to phase separate the block copolymer layer 120, the block copolymer layer 120 may be annealed for about 1 hour to 24 hours at a temperature ranging from about 130° C. to about 190° C.

The plurality of first domains 120A may be regularly arranged along with the plurality of pillar-shaped guides PG1. For example, a hexagonal array having a second pitch P2 that is less than the first pitch P1 may be achieved due to the plurality of first domains 120A and the plurality of pillar-shaped guides PG1.

Since the side walls of the plurality of pillar-shaped guides PG1 are covered by the major block affinity liner 110M, when the block copolymer layer 120 is phase separated, the second domain 120B including the second polymer block corresponding to a major block of the block copolymer layer 120 may be self-aligned to be in contact with the major block affinity liner 110M. The first domain 120A including the first polymer block corresponding to a minor block of the block copolymer layer 120 may be self-aligned to be spaced apart from the major block affinity liner 110M.

The block copolymer layer 120 is formed on the neutral liner 110N of which affinity for each of the first polymer block and the second polymer block is approximately same on the first mask pattern 106P. Thus, when the block copolymer layer 120 is phase separated, a vertical orientation characteristic of the first domain 120A may be improved.

In FIGS. 9A and 9B, the plurality of first domains 120A are self-aligned in a cylindrical shape at a central portion of a triangle formed by three pillar-shaped guides PG1 that are adjacent to one another from among the plurality of pillar-shaped guides PG1.

Figure 14:
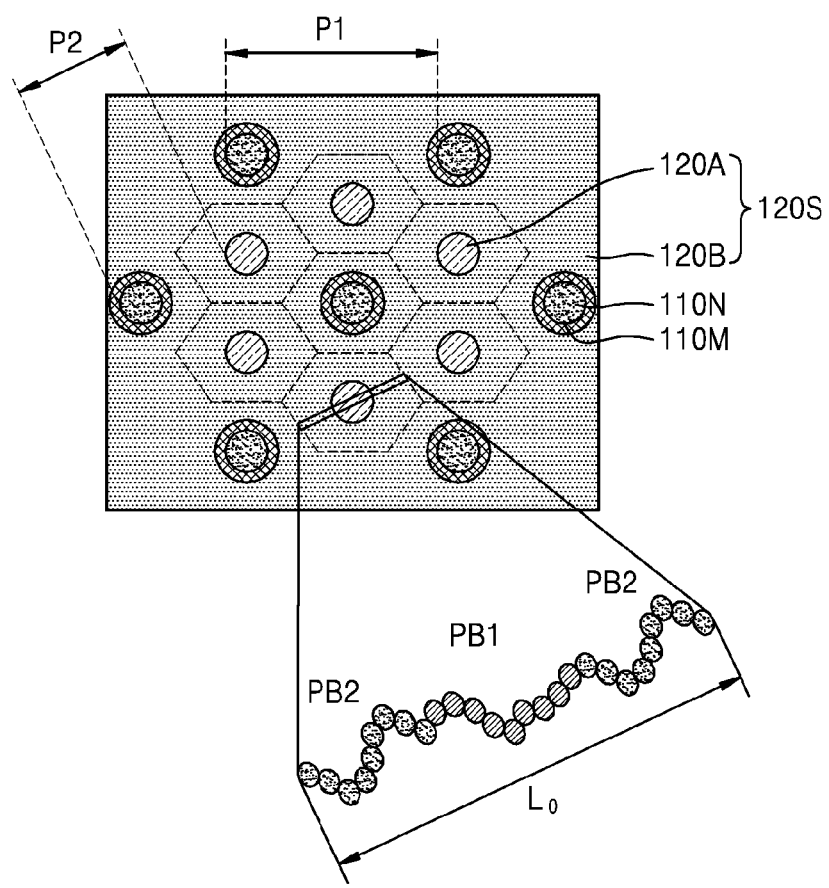
FIG. 14 is a detailed plan view for explaining a first domain and a second domain formed by using a method of forming a fine pattern, according to an exemplary embodiment.

FIG. 14 is a detailed plan view for explaining the plurality of first domains 120A and the second domain 120B that surrounds the plurality of first domains 120A, included in the self-assembled layer 120S of FIGS. 9A and 9B, according to an exemplary embodiment.

A linked structure between the first polymer block PB1 included in each of the plurality of first domains 120A and the second polymer block PB2 included in the second domain 120B in the self-assembled layer 120S is illustrated in FIG. 14. The bulk period $L_0$ that is determined in the linked structure between the first polymer block PB1 and the second polymer block PB2, that is, the bulk period $L_0$ corresponding to a unique pitch that is a repeating unit of the self-assembled structure obtained as a result of self-assembling of the block copolymer layer 120, may range from about 40 nm to about 60 nm.

In some exemplary embodiments, as shown in FIGS. 9A and 9B, in order for the plurality of first domains 120A to be self-aligned in a cylindrical shape at a central portion of a triangle formed by three pillar-shaped guides PG1 that are adjacent to one another from among the plurality of pillar-shaped guides PG1, the plurality of pillar-shaped guides PG1 of FIGS. 3A and 3B may be formed to be arranged in a hexagonal array having the first pitch P1 that is about 1.5 times the bulk period $L_0$ of the block copolymer layer 120.

Figure 16B:
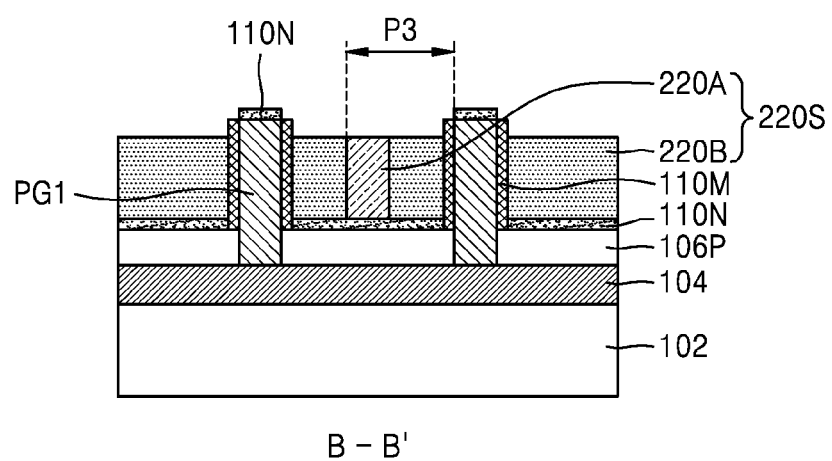

In other exemplary embodiments, at least due to phase separation of the block copolymer layer 120 of FIGS. 8A and 8B, as shown in FIGS. 16A and 16B, a self-assembled layer 220S including the plurality of first domains 220A that are self-aligned in a cylindrical shape at a central portion between two pillar-shaped guides PG1 that are adjacent to each other from among the plurality of pillar-shaped guides PG1 and a second domain 220B that surrounds the plurality of pillar-shaped guides PG1 and the plurality of first domains 220A may be formed. To this end, the plurality of pillar-shaped guides PG1 of FIGS. 3A and 3B may be formed to be arranged in a hexagonal array having the first pitch P1 that is about 2 times the bulk period $L_0$ of the block copolymer layer 120. In this case, the plurality of first domains 220A of FIGS. 16A and 16B may be regularly arranged along with the plurality of pillar-shaped guides PG1. For example, at least due to the plurality of first domains 220A and the plurality of pillar-shaped guides PG1, a hexagonal array having a third pitch P3 that is less than the first pitch P1 may be achieved.

Figure 15:
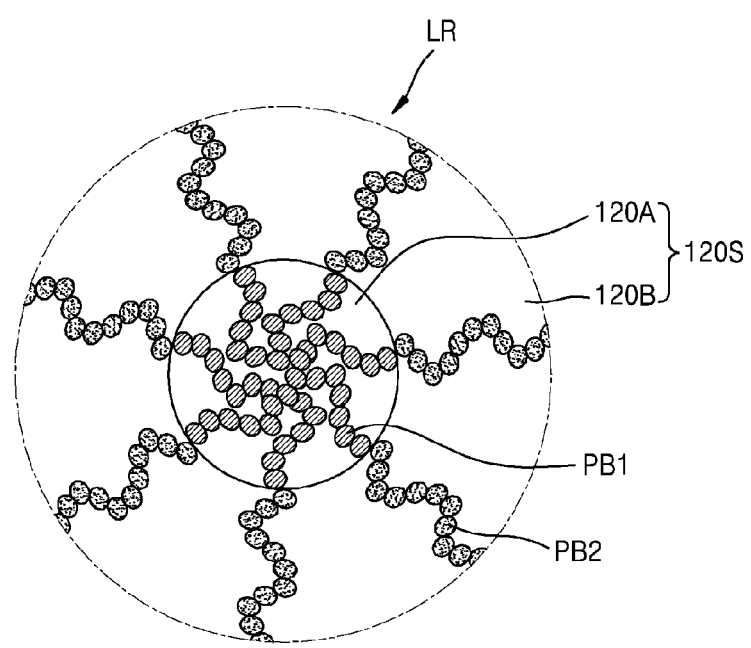
FIG. 15 is a schematic view illustrating a self-assembled structure of polymers formed by using a method of forming a fine pattern, according to an exemplary embodiment.

FIG. 15 is a schematic view illustrating a self-assembled structure of polymers included in a local region LR that is marked by a dash-dot line in the self-assembled layer 120S that is obtained as a result of a phase separation process of FIGS. 9A and 9B, according to an exemplary embodiment.

As shown in FIG. 15, the first polymer block PB1 is included in each of the first domains 120A, and the second polymer block PB2 is included in the second domain 120B that surrounds the first domains 120A. In some exemplary embodiments, the first polymer block PB1 may be PMMA, PEO, PLA, or PI, and the second polymer block PB2 may be PS.

Figure 10A:
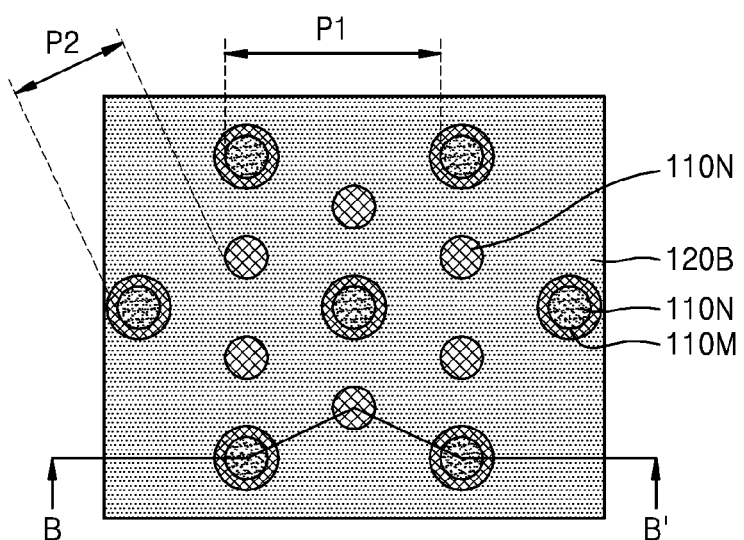
Figure 10B:
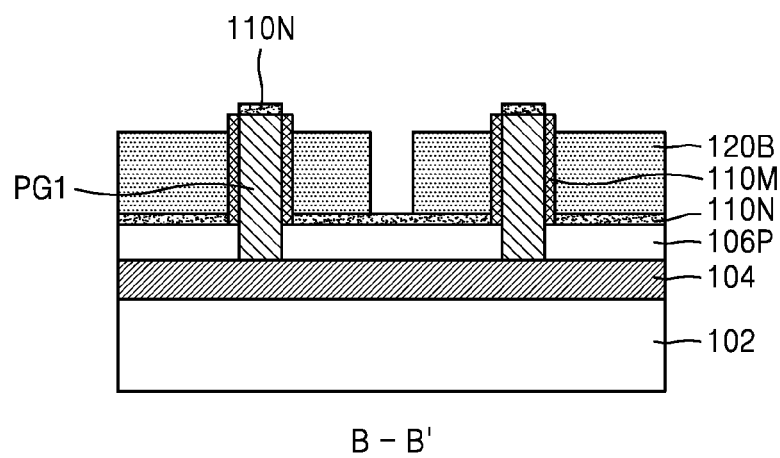

Referring to FIGS. 10A and 10B, the plurality of first domains 120A is removed from the self-assembled layer 120S (see FIGS. 6A and 6B).

In some exemplary embodiments, in order to selectively remove only the plurality of first domains 120A from the self-assembled layer 120S, the plurality of first domains 120A may be selectively decomposed by applying a polymer decomposer to the self-assembled layer 120S and a process of stripping the decomposed first domains 120A may be performed by using a cleaning fluid such as isopropyl alcohol (IPA). In some exemplary embodiments, radiant rays or plasma may be used as the polymer decomposer. The radiant rays may be applied in an oxygen atmosphere, and may be deep ultraviolet (DUV) rays, soft X-rays, or E-beams. The plasma may be oxygen plasma. In order to selectively decompose the plurality of first domains 120A, a type or energy of the polymer decomposer may be selected. For example, the plurality of first domains 120A and the second domain 120B may have different threshold energy at which they start to be decomposed. Accordingly, radiant rays or plasma having energy that may selectively decompose only the plurality of first domains 120A from among the plurality of first domains 120A and the second domain 120B may be applied to the self-assembled layer 120S. Radiant energy or plasma energy may be adjusted by using a time for which the radiant rays are applied or a time for which the plasma is exposed.

Figure 11A:
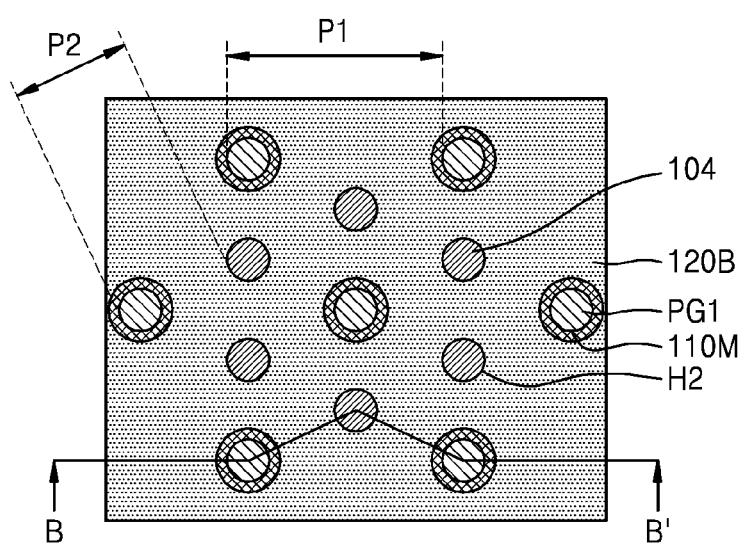
Figure 11B:
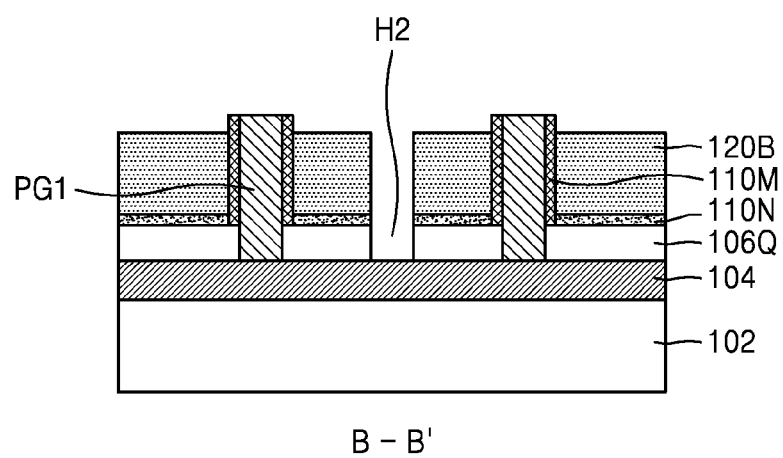

Referring to FIGS. 11A and 11B, a first mask pattern 106Q in which a plurality of self-assembled holes H2 corresponding to the plurality of first domains 120A are formed is formed in place of the first mask pattern 106P by etching the exposed neutral liner 110N and the first mask pattern 106P (see FIGS. 10A and 10B) by using the plurality of pillar-shaped guides PG1 and the second domain 120B as etch masks.

Figure 12A:
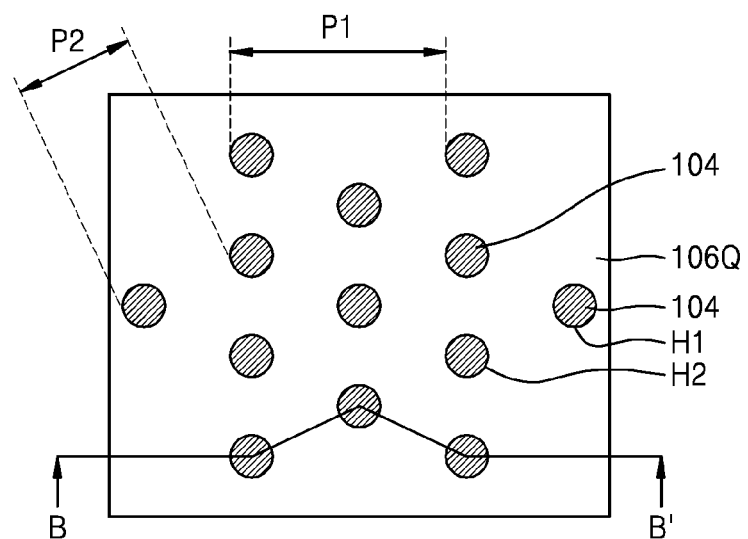
Figure 12B:
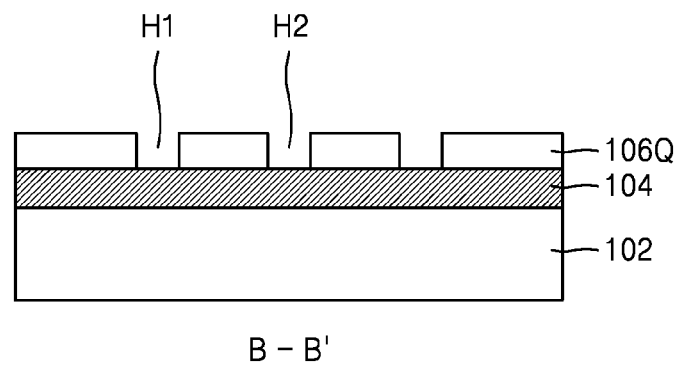

Referring to FIGS. 12A and 12B, a top surface of the first mask pattern 106Q is exposed by removing the plurality of pillar-shaped guides PG1 and the second domain 120B remaining on the first mask pattern 106Q.

The etched film 104 may be exposed through the plurality of self-assembled holes H2 and the plurality of guide forming holes H1 formed in the first mask pattern 106Q.

Figure 13A:
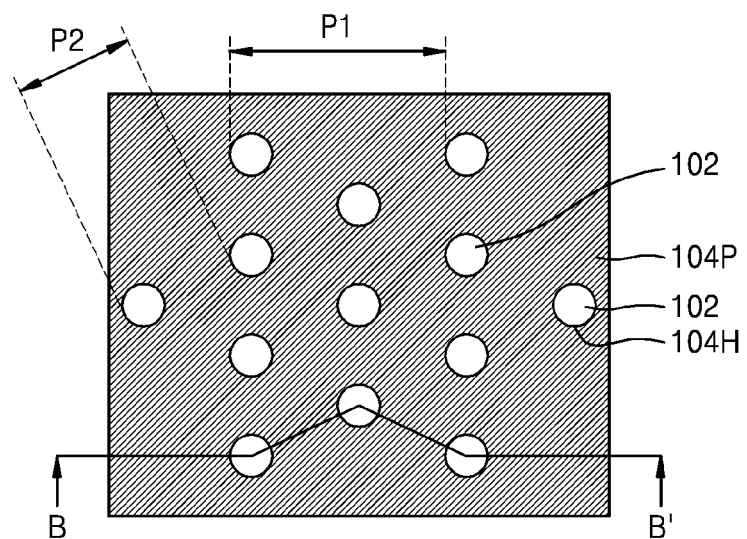
Figure 13B:
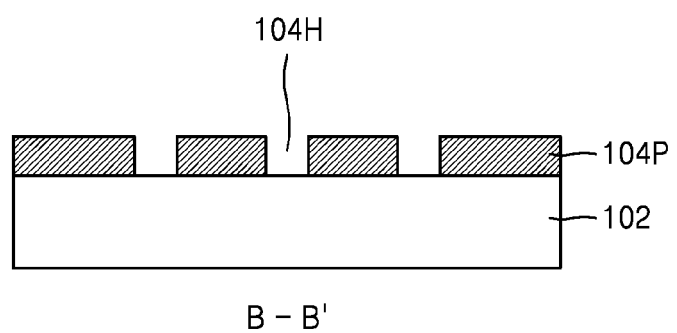

Referring to FIGS. 13A and 13B, a fine pattern 14P in which a plurality of holes 104H are formed is formed by etching portions of the etched film 104 that are exposed through the plurality of guide forming holes H1 and the plurality of self-assembled holes H2 by using the first mask pattern 106Q (see FIGS. 12A and 12B) as an etch mask.

Thereafter, a top surface of the fine pattern 104P is exposed by removing unnecessary films remaining on the fine pattern 104P.

According to the method of forming the fine pattern described with reference to FIGS. 1A through 13B, the block copolymer layer 120 is formed by covering the side walls of the plurality of pillar-shaped guides PG1 with the major block affinity liner 110M and covering the top surface of the first mask pattern 106P with the neutral liner 110N. Thus, a part of the block copolymer layer 120 facing the plurality of pillar-shaped guides PG1 contacts the major block affinity liner 110M, and a part of the block copolymer layer 120 facing the top surface of the first mask pattern 106P contacts the neutral liner 11 ON. Thus, while the block copolymer layer 120 is phase separated, defects or malfunctions that may occur when the plurality of pillar-shaped guides PG1 have hydrophilic properties may be prevented. For example, when the block copolymer layer 120 is phase separated, at least due to the hydrophilic properties of the plurality of pillar-shaped guides PG1, the first polymer block, for example, a PMMA domain, may undesirably remain in a ring shape or discontinuous ring shape around the plurality of pillar-shaped guides PG1. However, since the major block affinity liner 110M having a greater affinity for the second polymer block is formed on the surfaces of the plurality of pillar-shaped guides PG1, surface characteristics of portions of the plurality of pillar-shaped guides PG1 facing the block copolymer layer 120 are changed, thereby preventing defects having such a ring or discontinuous ring shape. That is, defects may be prevented from occurring around the plurality of pillar-shaped guides PG1 and phase separation of the block copolymer layer 120 may be effectively performed by forming the major block affinity liner 110M having a higher surface affinity for the second polymer block than for the first polymer block on surfaces of the plurality of pillar-shaped guides PG1. Accordingly, when a pattern that is necessary to manufacture a highly integrated semiconductor device exceeding a resolution limit in a photolithography process is formed, a plurality of hole patterns that are repeatedly formed at fine pitches may be easily formed. When the block copolymer layer 120 is formed on the first mask pattern 106P, the block copolymer layer 120 is formed on the first mask pattern 106P covered by the neutral liner 110N of which affinity for each of the first polymer block and the second polymer block is approximately the same, thereby improving a vertical orientation characteristic of the first domain 120A when the block copolymer layer 120 is phase separated.

FIGS. 16A and 16B are views for explaining a method of forming a fine pattern, according to another exemplary embodiment, wherein FIG. 16A is a plan view illustrating major parts for explaining the method and FIG. 16B is a cross-sectional view taken along line B-B' of FIG. 16A.

FIGS. 16A and 16B are views for explaining an example of an arrangement structure different from an arrangement structure of FIGS. 9A and 9B after phase separating the block copolymer layer 120 of FIGS. 8A and 8B, in which a self-assembled layer 220S including a plurality of first domains 220A self-aligned in a cylindrical shape and a second domain 220B surrounding the plurality of pillar-shaped guides PG1 and the plurality of first domains 220A is formed at a central portion between the two pillar-shaped guides PG1 that are adjacent to each other.

To obtain the arrangement structure of FIGS. 16A and 16B after phase separating the block copolymer layer 120, when the plurality of pillar-shaped guides PG1 described with reference to FIGS. 3A and 3B is formed, the plurality of pillar-shaped guides PG1 may be formed to be arranged in a hexagonal array having the first pitch P1 that is about 2 times the bulk period $L_0$ of the block copolymer layer 120. In this case, the plurality of first domains 220A of FIGS. 16A and 16B may be regularly arranged along with the plurality of pillar-shaped guides PG1. For example, a hexagonal array having a third pitch P3 that is less than the first pitch P1 may be achieved due to the plurality of first domains 220A and the plurality of pillar-shaped guides PG1.

Figure 17A:
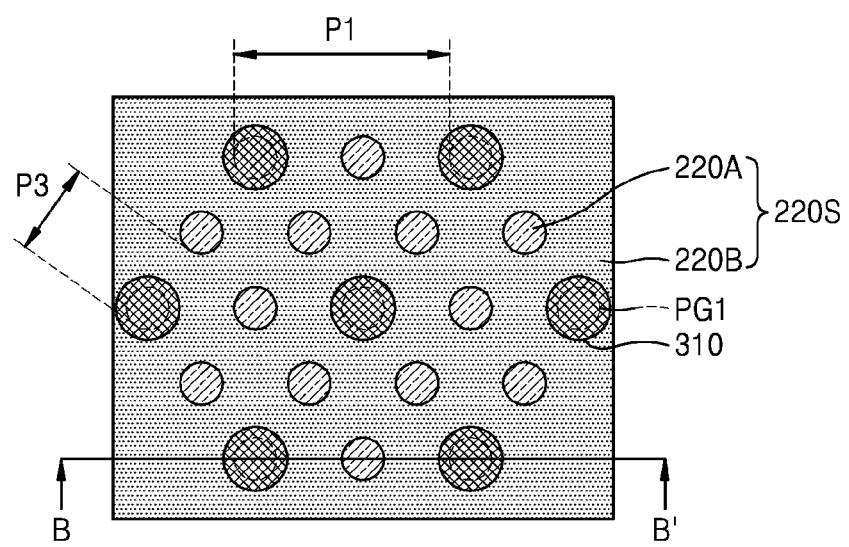
Figure 17B:
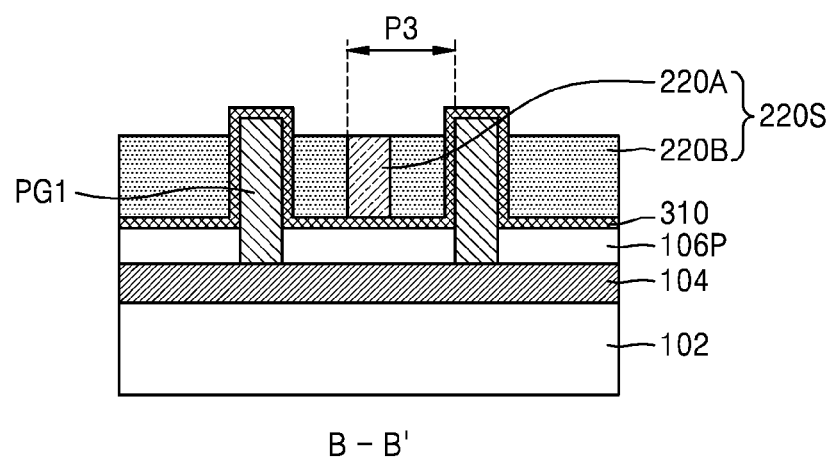

FIGS. 17A and 17B are views for explaining a method of forming a fine pattern, according to another exemplary embodiment, wherein FIG. 17A is a plan view illustrating major parts for explaining the method, and FIG. 17B is a cross-sectional view taken along line B-B' of FIG. 17A.

Similarly to those illustrated in FIGS. 16A and 16B, FIGS. 17A and 17B show that the self-assembled layer 220S including the plurality of first domains 220A self-aligned in a cylindrical shape and the second domain 220B surrounding the plurality of pillar-shaped guides PG1 and the plurality of first domains 220A is formed at a central portion between the two pillar-shaped guides PG1 that are adjacent to each other.

To form the self-assembled layer 220S including the plurality of first domains 220A and the second domain 220B, the method of forming the fine pattern of FIGS. 17A and 17B may form a blanket liner 310 formed of the same material as that of the blanket liner 110BL described with reference to FIGS. 5A and 5B on not only a surface of each of the plurality of pillar-shaped guides PG1 but also a top surface of the first mask pattern 106P, may form the block copolymer layer 120 as described with reference to FIGS. 8A and 8B on the blanket liner 310, and may perform a phase separation process of the block copolymer layer 120.

The blanket liner 310 of FIGS. 17A and 17B is formed of a material having a greater affinity for a second polymer block like the major block affinity liner 110M of FIGS. 6A and 6B. Thus, surface characteristics of portions of the plurality of pillar-shaped guides PG1 and the first mask pattern 106P that contact the block copolymer layer 120 are changed by the blanket liner 310, thereby preventing defects having a ring or discontinuous ring shape from occurring around the plurality of pillar-shaped guides PG1.

Figure 18A:
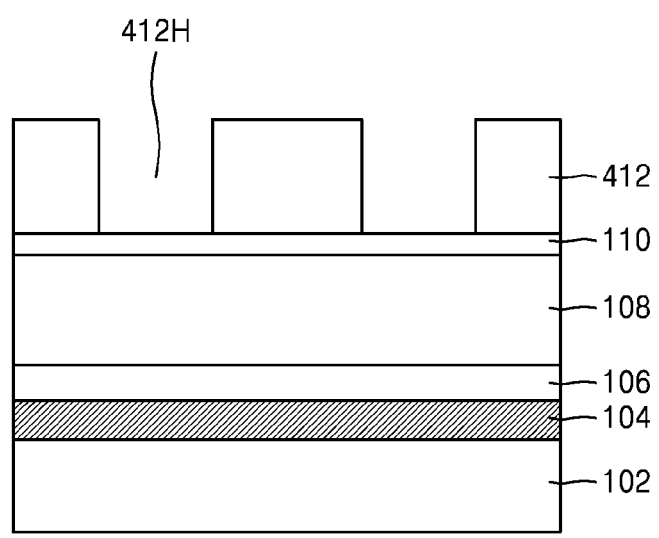
FIGS. 18A through 18O are cross-sectional views for sequentially explaining a method of forming a fine pattern, according to another exemplary embodiment.
Figure 18B:
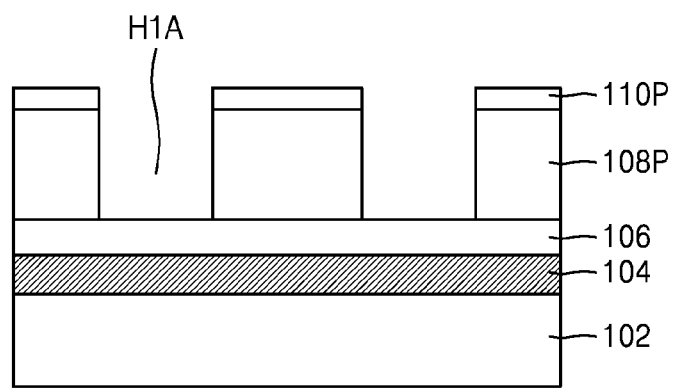
Figure 18C:
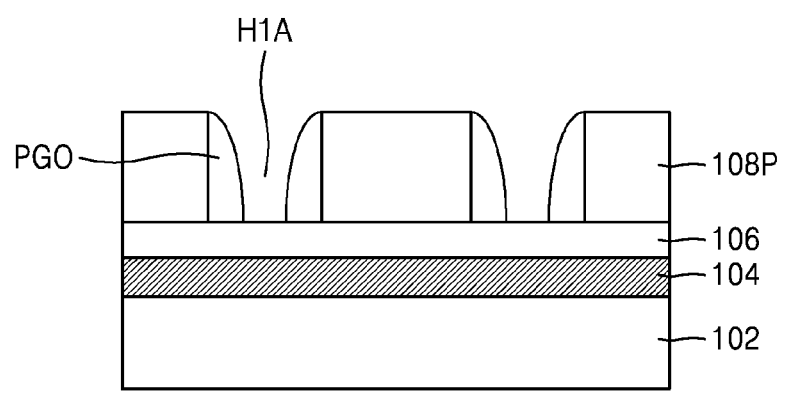
Figure 18D:
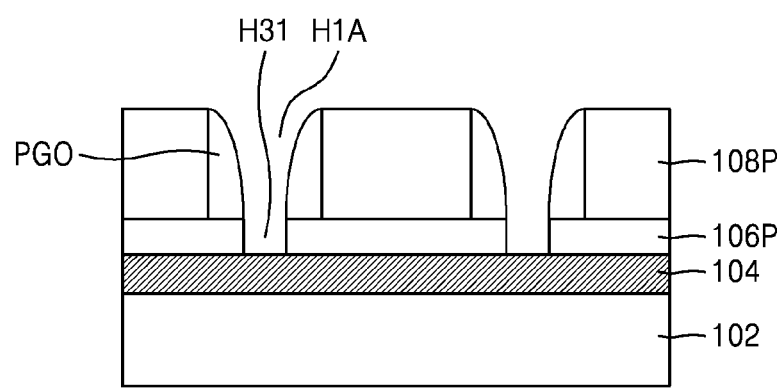
Figure 18E:
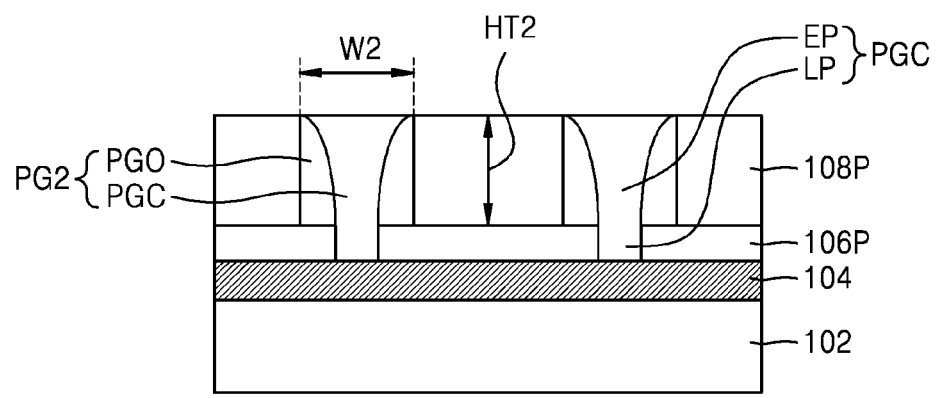
Figure 18F:
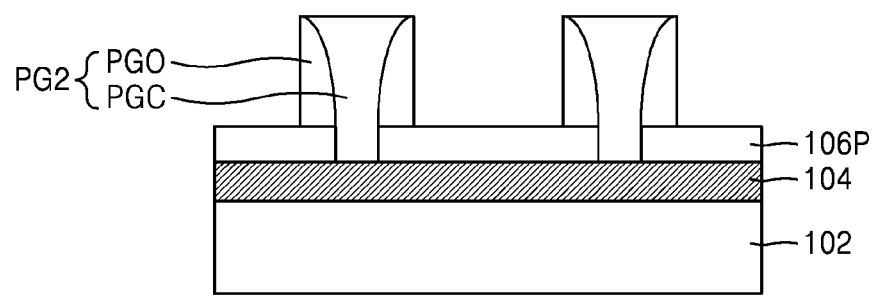
Figure 18G:
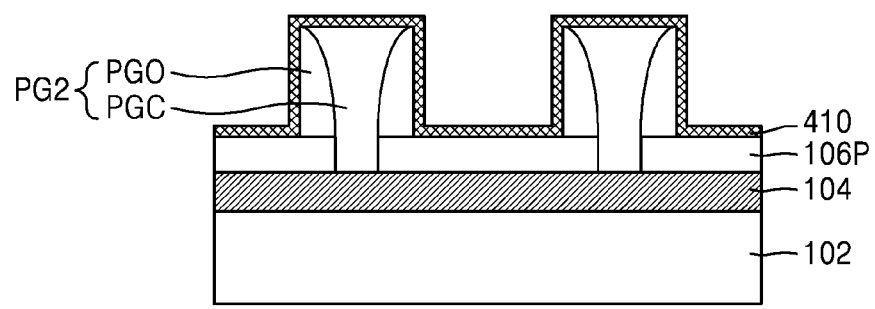
Figure 18H:
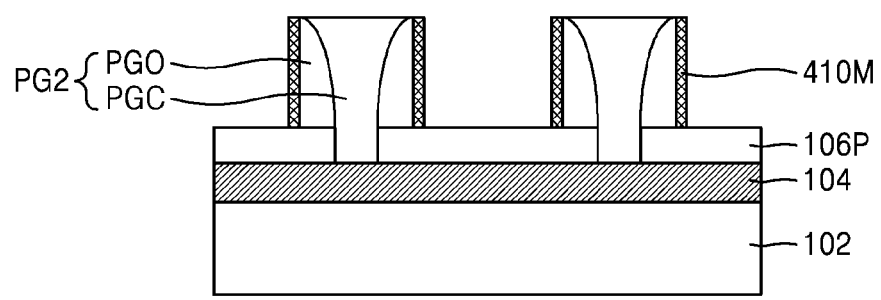
Figure 18I:
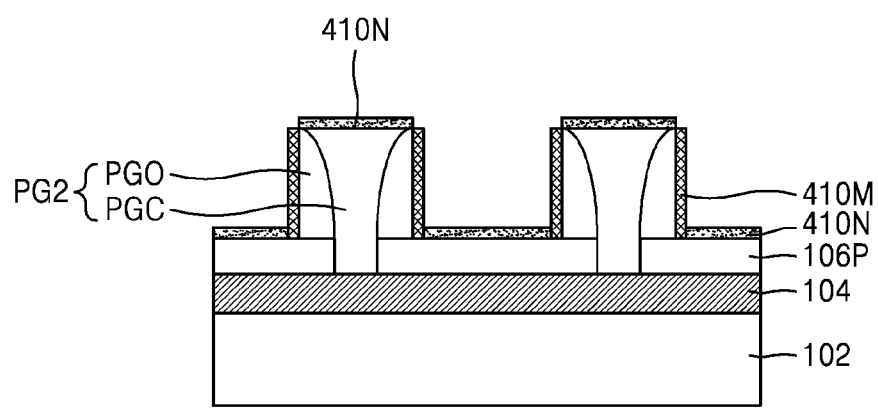
Figure 18J:
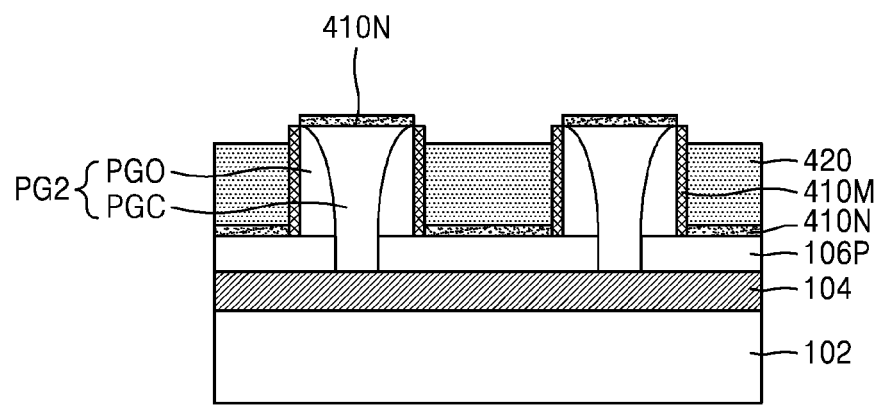
Figure 18K:
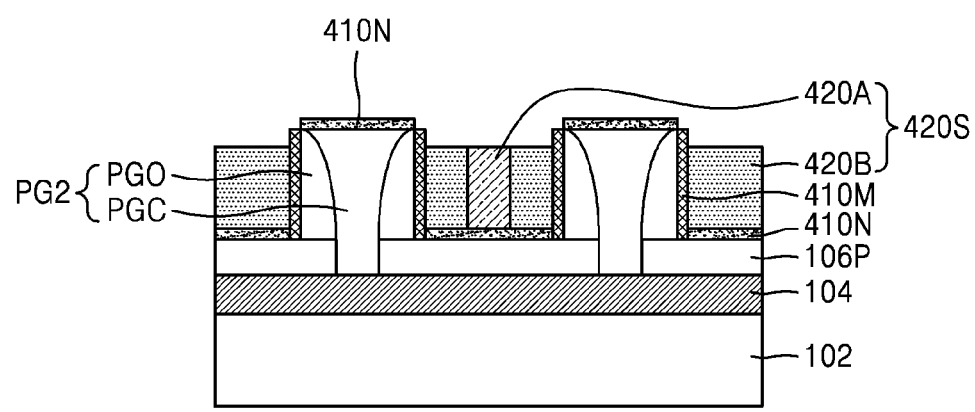
Figure 18L:
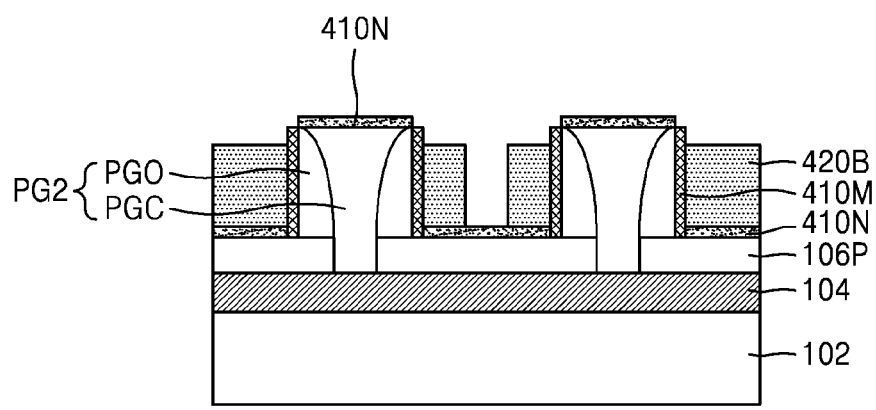
Figure 18M:
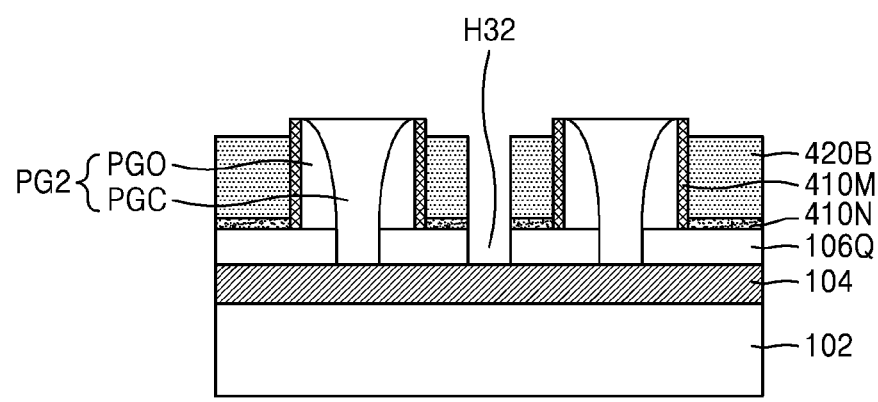
Figure 18N:
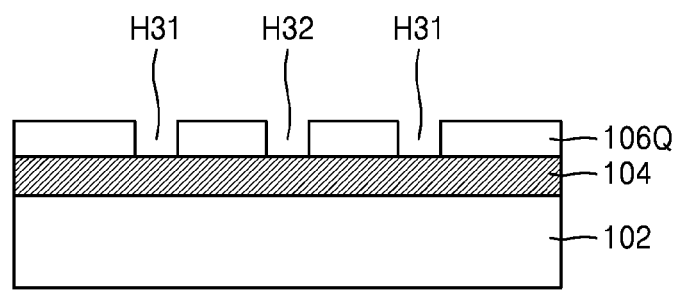
Figure 18O:
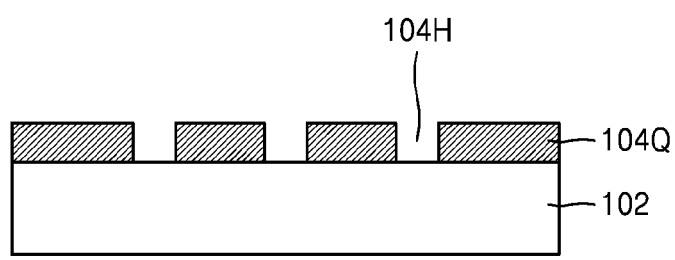

FIGS. 18A through 18O are cross-sectional views for sequentially explaining a method of forming a fine pattern, according to another exemplary embodiment.

The method of forming the fine pattern including an operation of forming pillar-shaped guides having a different structure from that of the pillar-shaped guides PG1 of FIGS. 1A through 17B will now be described with reference to FIGS. 18A through 18O. In FIGS. 18A through 18O, the same elements as those in FIGS. 1A through 17B are denoted by the same reference numerals, and detailed explanations thereof will not be given for brevity.

Referring to FIG. 18A, similarly to that described with reference to FIGS. 1A and 1B, the etched film 104 is formed on the substrate 102, and the first mask layer 106, the second mask layer 108, and the anti-reflection film 110 are sequentially formed on the etched film 104.

Thereafter, a third mask pattern 412 in which a plurality of holes 412H are formed is formed on the anti-reflection film 110.

The third mask pattern 412 is almost the same as the third mask pattern 112 of FIGS. 1A and 1B.

Referring to FIG. 18B, the second mask pattern 108P and the anti-reflection pattern 110P are formed by etching the anti-reflection film 110 and the second mask layer 108 by using the third mask pattern 412 (see FIGS. 1A and 1B) as an etch mask. As a result, a plurality of guide forming holes H1A that pass through the second mask pattern 108P are formed.

After the plurality of guide forming holes H1A are formed, the third mask pattern 412 may be removed.

Referring to FIG. 18C, a plurality of pillar-shaped guide outer walls PGO that cover side walls of the second mask pattern 108P in the plurality of guide forming holes H1A are formed.

In some exemplary embodiments, in order to form the plurality of pillar-shaped guide outer walls PGO, a first material layer may be formed to cover inner walls of the plurality of guide forming holes H1A and a top surface of the second mask pattern 108P in a resultant structure of FIG. 18B, and then the plurality of pillar-shaped guide outer walls PGO may remain only on the side walls of the second mask pattern 108P in the plurality of guide forming holes H1A by etching back the first material layer. A process of etching back the first material layer may be performed until the top surface of the second mask pattern 108P is exposed. In this process, the anti-reflection pattern 110P that remains on the second mask pattern 108P may be removed.

In some exemplary embodiments, the pillar-shaped guide outer walls PGO may be formed of a material including Si, for example, silicon oxide.

Referring to FIG. 18D, the first mask pattern 106P in which a plurality of first holes H31 are formed is formed by etching portions of the first mask layer 106 that are exposed through the plurality of guide forming holes H1A (see FIG. 18C) by using the second mask pattern 108P and the plurality of pillar-shaped guide outer walls PGO as etch masks.

The plurality of guide forming holes H1A and the plurality of first holes H31 provide a plurality of inner spaces for forming a plurality of pillar cores PGC that will be described with reference to FIG. 18E below.

Referring to FIG. 18E, the plurality of pillar cores PGC that fill the plurality of first holes H31 and the plurality of guide forming holes H1A (see FIG. 18D) are formed, and a plurality of pillar-shaped guides PG2 including the plurality of pillar-shaped guide outer walls PGO and the plurality of pillar cores PGC are formed.

The plurality of pillar cores PGC include lower portions LP that fill the first holes H31 and extending portions EP that are integrally formed with the lower portions LP, fill inner spaces defined by the guide forming holes H1A, and protrude upward beyond the first mask pattern 106P.

In some exemplary embodiments, in order to form the plurality of pillar cores PGC, a second material layer having a thickness great enough to fill the plurality of first holes H31 and the plurality of guide forming holes H1A may be formed on the substrate 102, and then the plurality of pillar cores PGC may remain by etching back or planarizing the second material layer.

The plurality of pillar cores PGC may be formed of a material including Si, for example, silicon oxide. In some exemplary embodiments, the plurality of pillar cores PGC and the plurality of pillar-shaped guide outer walls PGO may be formed of the same material.

Similarly to the plurality of pillar-shaped guides PG1 described with reference to FIGS. 3A and 3B, the plurality of pillar-shaped guides PG2 may be formed to be arranged in a hexagonal array having a pitch that is at least 1.5 times the bulk period $L_O$ of the block copolymer layer 120 that is formed around the plurality of pillar-shaped guides PG2 in a subsequent process.

In some embodiments, the plurality of pillar-shaped guides PG2 may be formed to be arranged in a hexagonal array having a pitch that is about 1.73 times the bulk period $L_O$ of the block copolymer layer 120 that is formed around the plurality of pillar-shaped guides PG2 in a subsequent process. In this case, similarly to that described with reference to FIGS. 9A and 9B, the plurality of first domains 120A that are formed due to a phase separation process of the block copolymer layer 120 may be self-aligned in a cylindrical shape at a central portion between three pillar-shaped guides PG2 that are adjacent to one another from among the plurality of pillar-shaped guides PG2.

In other exemplary embodiments, the plurality of pillar-shaped guides PG2 may be formed to be arranged in a hexagonal array having the first pitch P1 that is N times (N is an integer equal to or greater than 2) the bulk period $L_O$ of the block copolymer layer 120. For example, the plurality of pillar-shaped guides PG2 may have the first pitch P1 that is two times the bulk period $L_O$ of the block copolymer layer 120. In this case, similarly to that described with reference to FIGS. 16A through 17B, the plurality of first domains 220A that are formed due to a phase separation process of the block copolymer layer 120 may be self-aligned in a cylindrical shape at a central portion between two pillar-shaped guides PG2 that are adjacent to each other from among the plurality of pillar-shaped guides PG2.

A height HT2 of an extension unit EP of each of portions of the plurality of pillar-shaped guides PG2 that protrude upward beyond the first mask pattern 106P may range from, but is not limited to, about 10 nm to about 500 nm.

Referring to FIG. 18F, a top surface of the first mask pattern 106P and top surfaces and side walls of the plurality of pillar-shaped guides PG2 are exposed by removing the second mask pattern 108P (see FIG. 18E).

Referring to FIG. 18G, similarly to the process of forming the blanket liner 110BL described with reference to FIGS. 5A and 5B, a blanket liner 410 that covers the exposed surface of the first mask pattern 106P and the exposed top surfaces and side walls of the plurality of pillar-shaped guides PG2 is formed.

In some exemplary embodiments, a detailed configuration of the blanket liner 410 is the same as that of the blanket liner 110BL described with reference to FIGS. 5A and 5B.

Referring to FIG. 18H, similarly to the process of forming the major block affinity liner 110M described with reference to FIGS. 6A and 6B, a major block affinity liner 410M covering a side wall of each of the plurality of pillar-shaped guides PG2 is formed by removing a part of the blanket liner 410, and a local region of the first mask pattern 106P is exposed.

Referring to FIG. 18I, similarly to the process of forming the neutral liner 110N described with reference to FIGS. 7A and 7B, while each of the side walls of the plurality of pillar-shaped guides PG2 is covered by the major block affinity liner 410M, the neutral liner 410N is formed on a top surface of the first mask pattern 106P exposed between the plurality of pillar-shaped guides PG2.

Referring to FIG. 18J, similarly to that described with reference to FIGS. 8A and 8B, the block copolymer layer 420 formed of a pure block copolymer including a first polymer block having a first repeating unit and a second polymer block having a second repeating unit is formed around the plurality of pillar-shaped guides PG2 on the first mask pattern 106P covered by the neutral liner 410N.

The block copolymer layer 420 may be spaced apart from the plurality of pillar-shaped guides PG2 with the major block affinity liner 410M therebetween and may be spaced apart from the first mask pattern 106P with the neutral liner 410N therebetween.

Referring to FIG. 18K, similarly to that described with reference to FIGS. 9A and 9B, a self-assembled layer 420S including a plurality of first domains 420A including the first polymer block and a second domain 420B that includes the second polymer block and surrounds the plurality of pillar-shaped guides PG2 and the plurality of first domains 420A is formed by phase separating the block copolymer layer 420.

Referring to FIG. 18L, the plurality of first domains 420A is removed from the self-assembled layer 420S (see FIG. 18K).

Referring to FIG. 18M, similarly to that described with reference to FIGS. 11A and 11B, the first mask pattern 106Q in which a plurality of self-assembled holes H32 are formed is formed in the first mask pattern 106P by etching the exposed neutral liner 410N and the first mask pattern 106P (see FIG. 14C) by using the plurality of pillar-shaped guides PG2 and the second domain 420B as etch masks. The plurality of self-assembled holes H32 may have a shape corresponding to an arrangement shape of the plurality of first domains 420A.

Referring to FIG. 18N, a top surface of the first mask pattern 106Q is exposed by removing unnecessary films including the plurality of pillar-shaped guides PG2, the second domain 420B, and the major block affinity liner 410M remaining on the first mask pattern 106Q.

The etched film 104 may be exposed through a plurality of guide forming holes H31 and the plurality of self-assembled homes H32 formed in the first mask pattern 106Q.

Referring to FIG. 18O, a fine pattern 104Q in which a plurality of holes 104H are formed is formed by etching portions of the etched film 104 that are exposed through the plurality of guide forming holes H31 and the plurality of self-assembled holes H32 by using the first mask pattern 106Q (see FIG. 18N) as an etch mask.

Thereafter, a top surface of the fine pattern 104Q is exposed by removing unnecessary films remaining on the fine pattern 104Q.

According to the method of forming the fine pattern described with reference to FIG. 18A through 18O, defects or malfunctions of a ring or discontinuous ring shape that may occur when the plurality of pillar-shaped guides PG2 have hydrophilic properties may be prevented. Thus, defects may be prevented from occurring around the plurality of pillar-shaped guides PG2 and phase separation of the block copolymer layer 120 may be effectively performed. When the block copolymer layer 120 is formed on the first mask pattern 106P, the block copolymer layer 120 is formed on the first mask pattern 106P covered by the neutral liner 410N of which affinity for each of the first polymer block and the second polymer block is approximately same, thereby improving a vertical orientation characteristic of the first domain 420A when the block copolymer layer 120 is phase separated.

Figure 19:
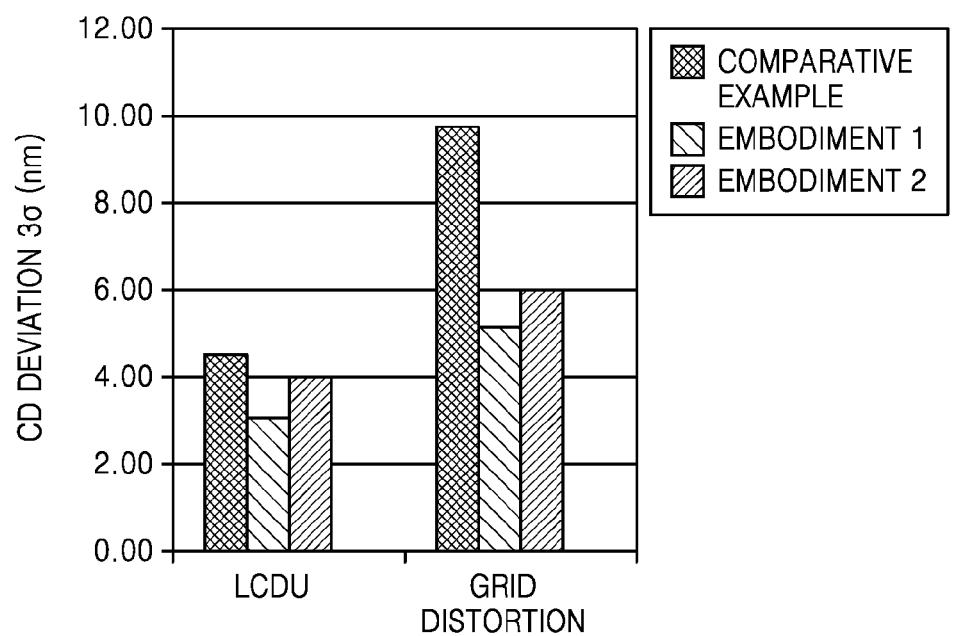
FIG. 19 is a graph showing a result of evaluating an influence of a surface characteristic of a part contacting a block copolymer layer on a phase separation effect of the block copolymer layer when a fine pattern is formed on a substrate according to a method of forming a fine pattern according to an exemplary embodiment.

FIG. 19 is a graph showing a result of evaluating an influence of a surface characteristic of a part contacting a block copolymer layer on a phase separation effect of the block copolymer layer when a fine pattern is formed on a substrate according to a method of forming a fine pattern according to an exemplary embodiment.

For the evaluation of FIG. 19A, a plurality of pillar-shaped guides formed as $SiO_2$ films and including hydrophilic surfaces having a CD of 63 nm were formed on a silicon wafer. Thereafter, on exposed surfaces of the plurality of pillar-shaped guides and an exposed surface of a substrate, similarly to the neutral liner 110N described with reference to FIGS. 7A and 7B, a sample (embodiment 1) of a neutral liner formed of a PS-r-PMMA liner and having a thickness of 14 nm, and, similarly to the major block affinity liner 110M described with reference to FIGS. 6A and 6B, a sample (embodiment 2) of a major block affinity liner formed of PS were prepared. A block copolymer layer was formed by coating a PS-b-PMMA pure block copolymer having the bulk period $L_0$ of 54 nm on each of the samples of the embodiments 1 and 2, and was then annealed, and phase separated. Thereafter, a PMMA domain was removed by using DUV rays, rinsing was performed by using IPA, and a phase separation effect was evaluated.

As a comparative example, except for the process of forming the PS-r-PMMA liner and the process of forming the PS liner, in the same manner as in the embodiments 1 and 2, the phase separation effect of a PS-b-PMMA pure block copolymer having the bulk period $L_0$ of 54 nm was evaluated.

A result of FIG. 19A shows that the embodiments 1 and 2 have a small entire CD deviation (3 sigma deviation) with respect to a local CD uniformity (LCDU) and a grid distortion compared to the comparative example, and thus a phase separation characteristic of the embodiments 1 and 2 is better than that of the comparative example.

Figure 20:
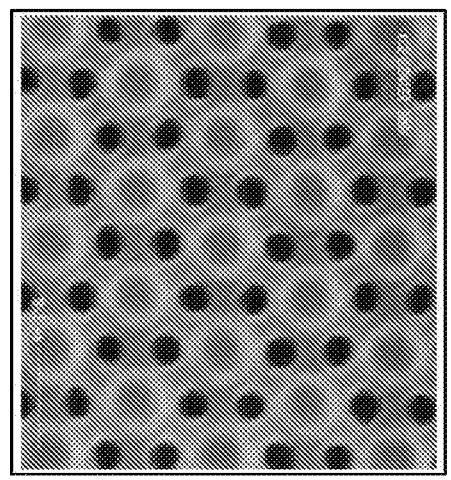
FIG. 20 is a photo of one phase separation image among embodiments used in the evaluation of FIG. 19.

FIG. 20 is a photo of a phase separation image of embodiment 2 used in the evaluation of FIG. 19.

FIG. 21 is a table showing a result of evaluating a phase separation characteristic of a PS-b-PMMA pure block copolymer by changing CDs of the plurality of pillar-shaped guides PG to 82.9 m, 77.0 nm, 71.9 nm, 67.4 nm, and 62.2 nm, when a pitch Lp of a plurality of pillar-shaped guides PG is 107.8 nm, and the bulk period $L_0$ of the PS-b-PMMA pure block copolymer is 53.9 nm and 62.2 nm.

As shown in FIG. 21, when the bulk period $L_0$ of the PS-b-PMMA pure block copolymer is 53.9 nm, a relatively good phase separation effect may be obtained when the CDs of the plurality of pillar-shaped guides PG are 82.9 m, 77.0 nm, and 71.9 nm, and a plurality of PMMA domains are self-aligned in a cylindrical shape at a central portion of a triangle formed by the three pillar-shaped guides PG that are adjacent to each another.

When the bulk period $L_0$ of the PS-b-PMMA pure block copolymer is 62.2 nm, a relatively good phase separation effect may be obtained when the CDs of the plurality of pillar-shaped guides PG are 77.0 nm, 71.9 nm, and 67.4 nm and the plurality of PMMA domains are self-aligned in the cylindrical shape at the central portion of the triangle formed by the three pillar-shaped guides PG that are adjacent to each another.

When the bulk period $L_0$ of the PS-b-PMMA pure block copolymer is 62.2 nm, although a relatively good phase separation effect may be obtained when the CD of the plurality of pillar-shaped guides PG is 62.2 nm, unlike the arrangement structures of the other examples, the plurality of PMMA domains are self-aligned in a cylindrical shape at a central portion of the two pillar-shaped guides PG that are adjacent to each another.

Figure 22:
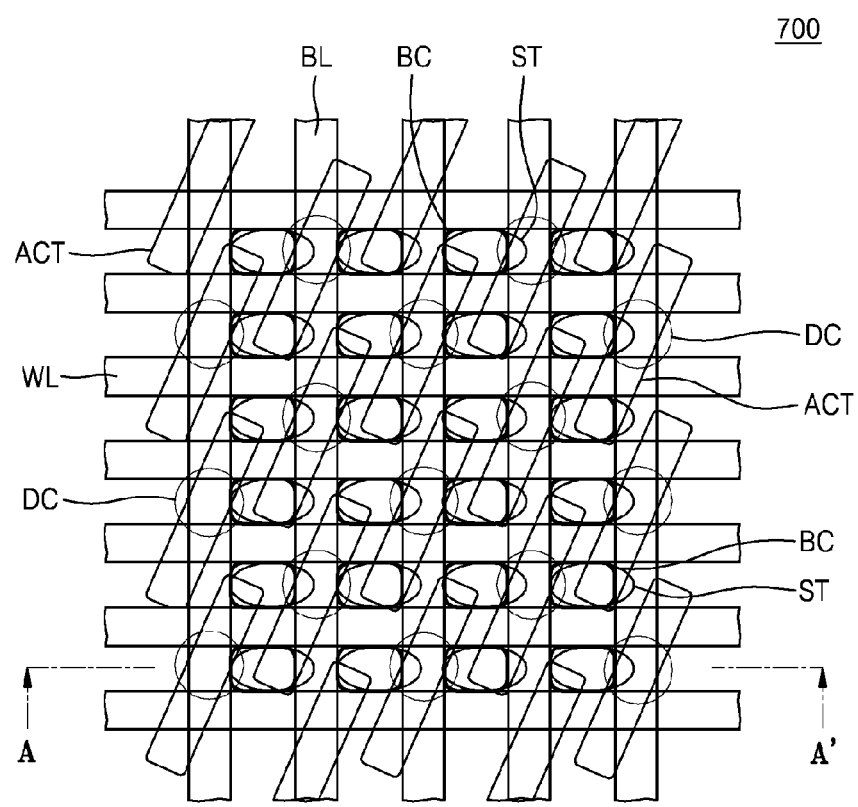
FIG. 22 is a plan layout illustrating an integrated circuit (IC) device that may be formed by using a method of forming a pattern, according to an exemplary embodiment.
Figure 22:
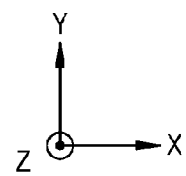

FIG. 22 is a plan layout illustrating an integrated circuit device 700 that may be formed by using a method of forming a pattern, according to an exemplary embodiment. The layout of FIG. 22 may constitute a cell array region of a semiconductor memory device.

Referring to FIG. 22, the memory cell array region of the integrated circuit device 700 includes a plurality of active regions ACT. A plurality of word lines WL extend in parallel in a first direction (X direction) to cross the plurality of active regions ACT. The plurality of word lines WL may be arranged at equal intervals. Over the plurality of word lines WL, a plurality of bit lines BL extend in parallel in a second direction (Y direction) that intersects the first direction.

The plurality of bit lines BL are connected to the plurality of active regions ACT through a plurality of direct contacts DC.

Each of a plurality of buried contacts BC may have a contact structure that extends from a space between two adjacent bit lines BL from among the plurality of bit lines BL to the top of one bit line BL from among the two adjacent bit lines BL. In some exemplary embodiments, the plurality of buried contacts BC may be aligned in the first direction (X direction) and the second direction (Y direction). In some exemplary embodiments, the plurality of buried contacts BC may be arranged at equal intervals in the second direction (Y direction). The plurality of buried contacts BC may electrically connect lower electrodes ST of capacitors to the active regions ACT.

Any method of forming a pattern of FIGS. 1A through 18O may be used to form unit devices of FIG. 22, for example, the plurality of active regions ACT, the plurality of word lines WL, the plurality of bit lines BL, the plurality of direct contacts DC, the plurality of buried contacts BC, and the plurality of lower electrodes ST.

FIGS. 23A through 23L are cross-sectional views for sequentially explaining a method of manufacturing an integrated circuit device by using the method of forming the pattern described with reference to FIGS. 1A through 18O, according to an exemplary embodiment. FIGS. 23A through 23L illustrate a configuration corresponding to a cross-section taken along a line A-A' of FIG. 22.

In FIGS. 23A through 23L, the same elements as those in FIGS. 1A through 18O are denoted by the same reference numerals, and detailed explanations thereof will not be given.

Figure 23A:
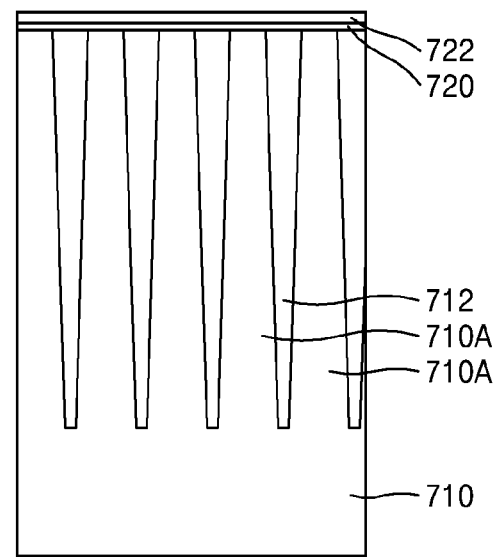
FIGS. 23A through 23L are cross-sectional views for sequentially explaining a method of manufacturing an IC device, according to an exemplary embodiment.

Referring to FIG. 23A, a plurality of active regions 710A are defined by forming a device isolation film 712 on a substrate 710.

A detailed explanation of the substrate 710 is the same as that of the substrate 102 of FIGS. 1A and 1B.

The plurality of active regions 710A may have relatively long island shapes each having a short axis and a long axis, like the active regions ACT of FIG. 18. In order to define the plurality of active regions 710A, at least one method from among methods of forming a pattern of FIGS. 1A through 18O may be used. For example, a plurality of pre-active regions having linear shapes that extend in parallel may be defined, and then at least one method from among the methods of forming a pattern of FIGS. 1A through 18O may be used during a trimming process for changing the pre-active regions having linear shapes into a plurality of active regions having desired island shapes.

The device isolation film 712 may be, but is not limited to, an oxide film, a nitride film, or a combination thereof. The device isolation film 712 may have a single-layer structure including one type of insulating film, or a multi-layer structure including a combination of at least two types of insulating films.

A plurality of word line trenches (not shown) are formed in the substrate 710. The plurality of word line trenches may extend in parallel in the X direction of FIG. 22, and may have linear shapes that cross the plurality of active regions 710A. A plurality of guide dielectric films, the plurality of word lines WL (see FIG. 22), and a plurality of buried insulating films are sequentially formed in the plurality of word line trenches.

In some exemplary embodiments, after the word lines WL are formed, source/drain regions may be formed on top surfaces of the plurality of active regions 710A by injecting impurity ions into the substrate 710. In other exemplary embodiments, a process of injecting impurity ions for forming the source/drain regions may be performed before the plurality of word lines WL are formed.

A first insulating film 720 and a second insulating film 722 are sequentially formed on the substrate 710. The first insulating film 720 may be, but is not limited to, an oxide film and the second insulating film 722 may be, but is not limited to, a nitride film.

Figure 23B:
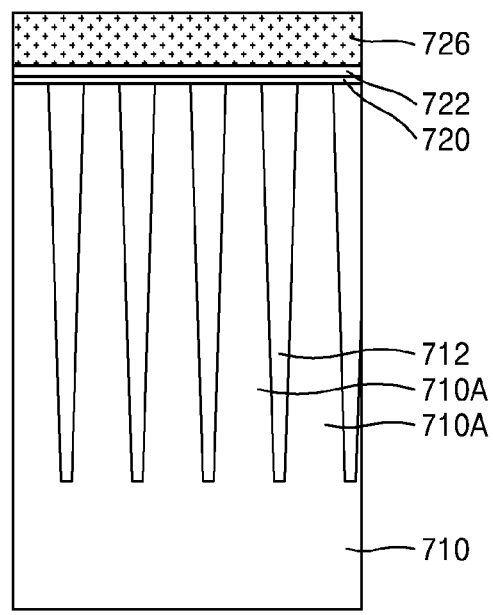

Referring to FIG. 23B, a first conductive layer 726 is formed on the substrate 710.

The first conductive layer 726 may be formed of, but is not limited to, doped polysilicon.

Figure 23C:
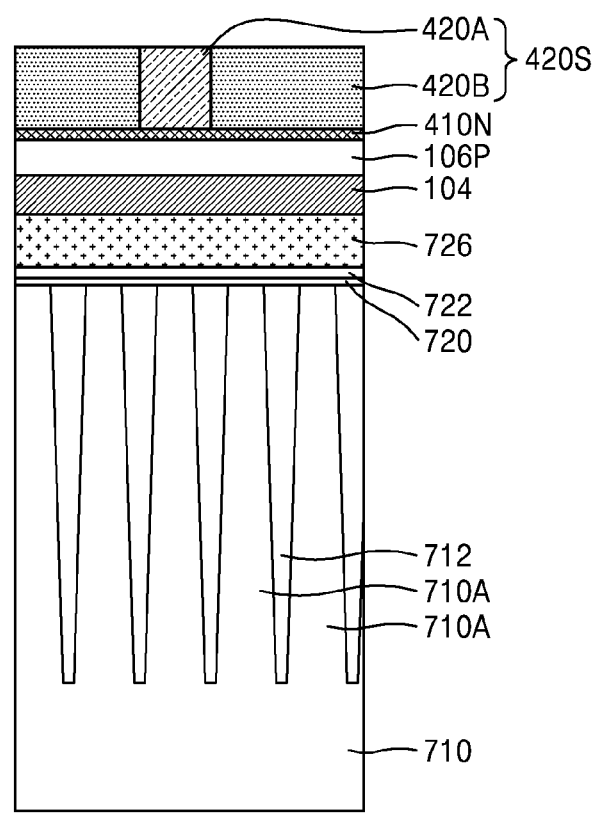

Referring to FIG. 23C, similarly to that described with reference to FIGS. 18A through 18K, the etched film 104 is formed on the first conductive layer 726, and the self-assembled layer 420S that is phase separated into the first domains 420A and the second domain 420B is formed on the first mask pattern 106P. However, the present exemplary embodiment is not limited thereto. For example, the method described with reference to FIGS. 1A through 13B, the method described with reference to FIGS. 16A and 16B, the method described with reference to FIGS. 17A and 17B and various modifications and variations thereof within the scope of the inventive concept may be used.

Figure 23D:
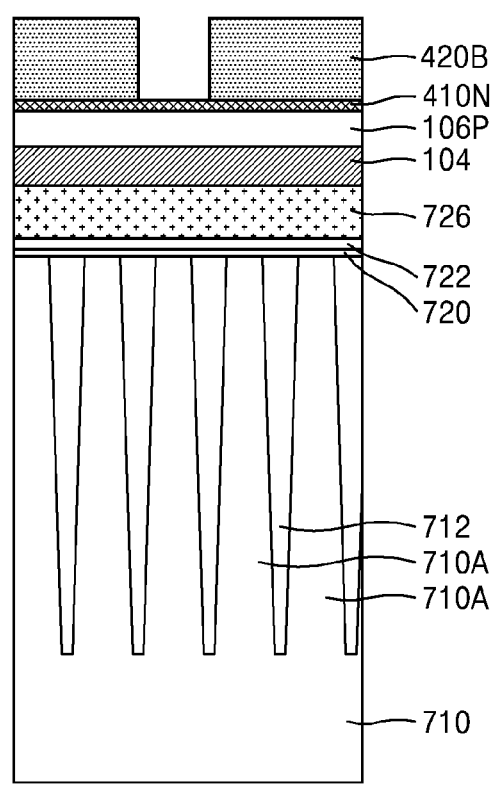

Referring to FIG. 23D, the first domains 420A are removed from the self-assembled layer 420S (see FIG. 23C).

Figure 23E:
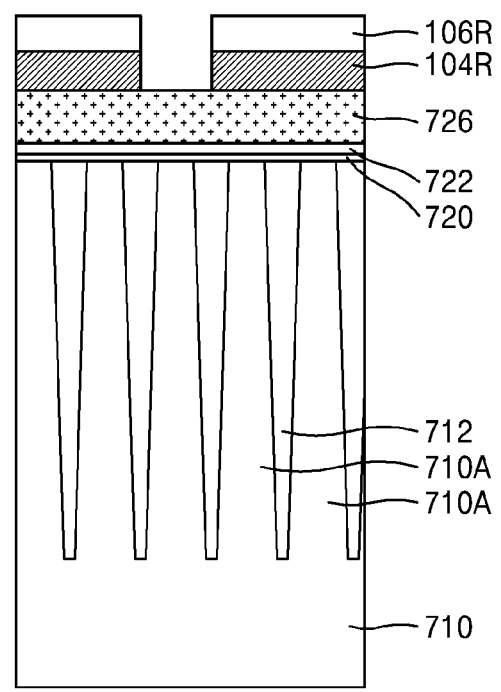

Referring to FIG. 23E, similarly to that described with reference to FIG. 18I, a first mask pattern 106R in which holes through which the etched film 104 is exposed are formed is formed by etching the first mask pattern 106P (see FIG. 23C) by using the plurality of pillar-shaped guides PG2 and the second domain 420B as etch masks.

Thereafter, unnecessary films on the first mask pattern 106R are removed, and similarly to that described with reference to FIG. 18O, a fine pattern 104R, in which holes through which the first conductive layer 726 is exposed are formed, is formed by etching the etched film 104 by using the first mask pattern 106R as an etch mask.

Figure 23F:
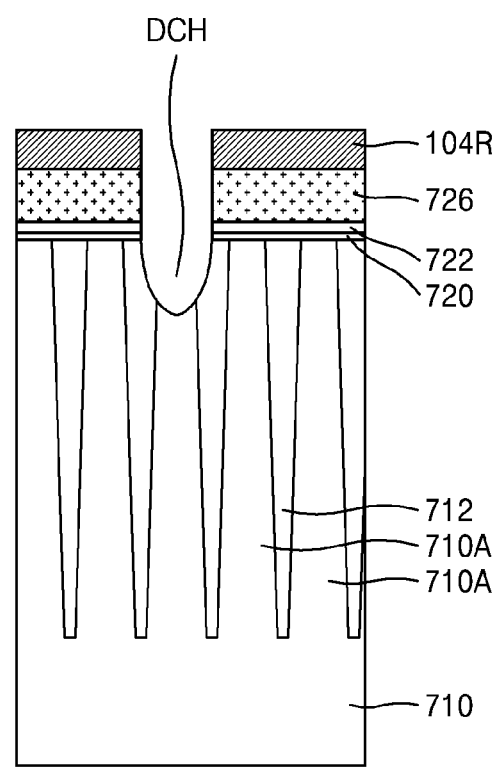

Referring to FIG. 23F, direct contact holes DCH through which the active regions 710A of the substrate 710 are exposed are formed by etching the first conductive layer 726 by using the fine pattern 104R as an etch mask and etching an exposed portion of the substrate 710 and an exposed portion of the device isolation film 712.

Although the first mask pattern 106R that covers the fine pattern 104R is removed in FIG. 23F, in some exemplary embodiments, the first mask pattern 106R may remain on the fine pattern 104R.

Figure 23G:
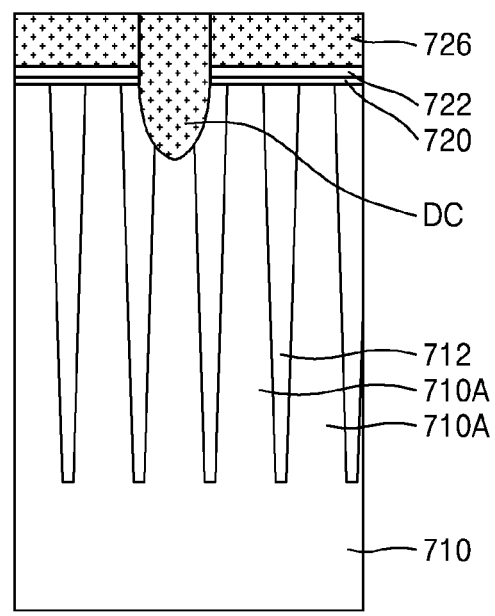

Referring to FIG. 23G, after the fine pattern 104R (see FIG. 23F) is removed, a second conductive layer having a thickness great enough to fill the direct contact holes DCH is formed on the first conductive layer 726 and in the direct contact holes DCH, the second conductive layer is etched back so that the second conductive layer remains only in the direct contacts DCH, and direct contacts DC including the second conductive layer remaining in the direct contact holes DCH are formed.

The direct contacts DC may be formed of, but are not limited to, doped polysilicon.

Figure 23H:
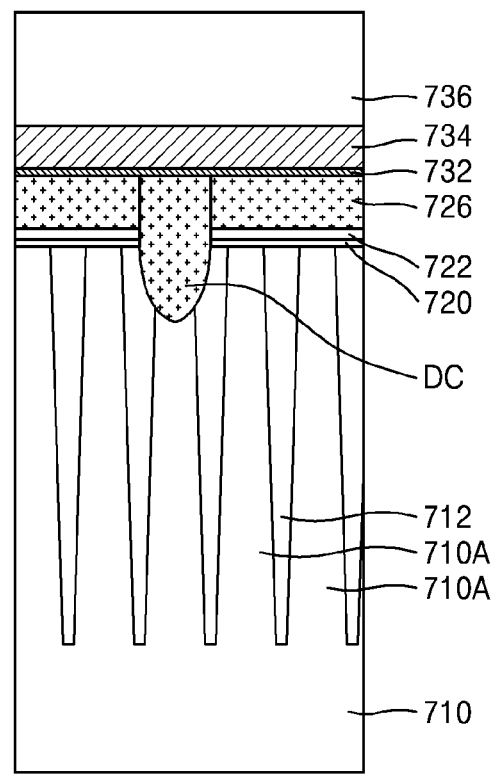

Referring to FIG. 23H, a third conductive layer 732, a fourth conductive layer 734, and an insulating capping layer 736 are sequentially formed on the first conductive layer 726 and the direct contacts DC.

Each of the third conductive layers 732 and the fourth conductive layer 734 may be formed of, but is not limited to, TiN, TiSiN, W, tungsten silicide, or a combination thereof. In some exemplary embodiments, the third conductive layer 732 may include TiSiN and the fourth conductive layer 7354 may include W.

The insulating capping layer 736 may be formed of a silicon nitride film.

Figure 23I:
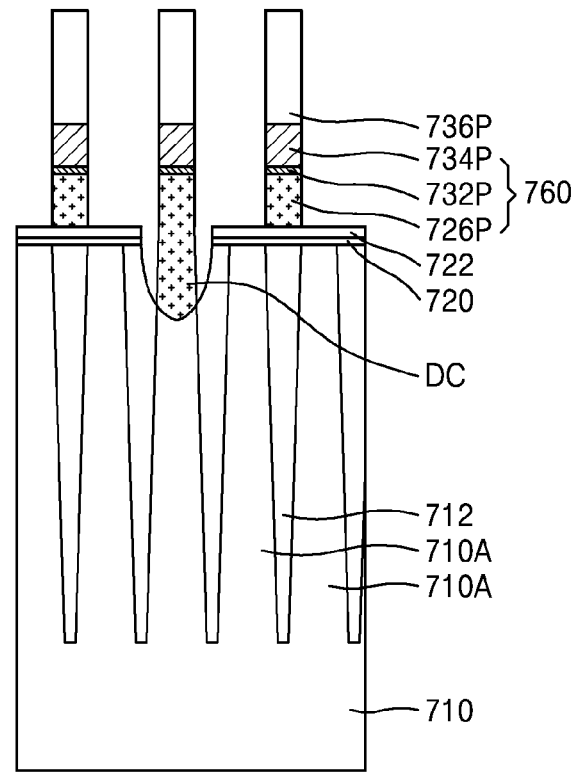

Referring to FIG. 23I, an insulating capping pattern 736P is formed by patterning the insulating capping layer 736 by using a photolithography process, and a plurality of bit lines 760 are formed by etching a part of a lower structure by using the insulating capping pattern 736P as an etch mask.

In order to form the plurality of bit lines 760, the plurality of bit lines 76Q including a first conductive pattern 726P, a third conductive pattern 732P, and a fourth conductive pattern 734P are formed by sequentially etching parts of the fourth conductive layer 734, the third conductive layer 732, the first conductive layer 726, and the direct contacts DC by using the insulating capping pattern 736P as an etch mask. The plurality of bit lines 760 may be connected to the active regions 710A of the substrate 710 through the direct contacts DC.

Figure 23J:
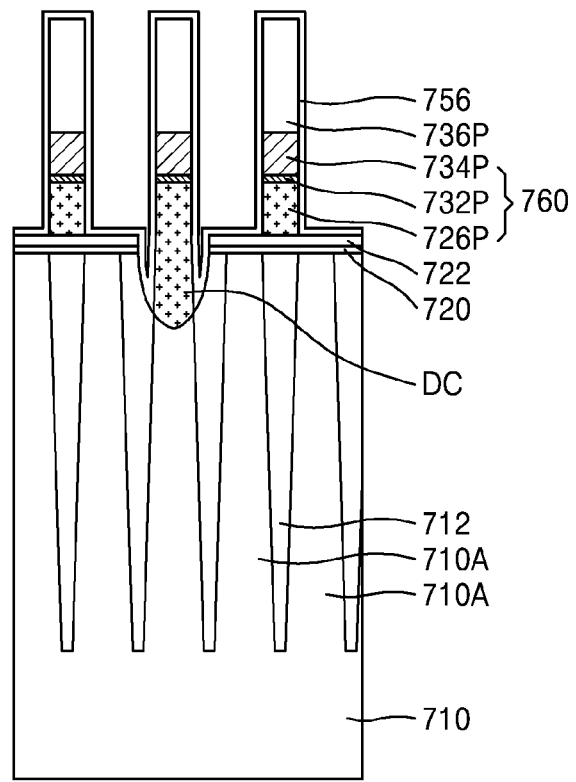

Referring to FIG. 23J, an insulating liner 756 is formed on an exposed top surface of a resultant structure including the plurality of bit lines 760.

The insulating liner 756 may be formed of, but is not limited to, a nitride film.

Figure 23K:
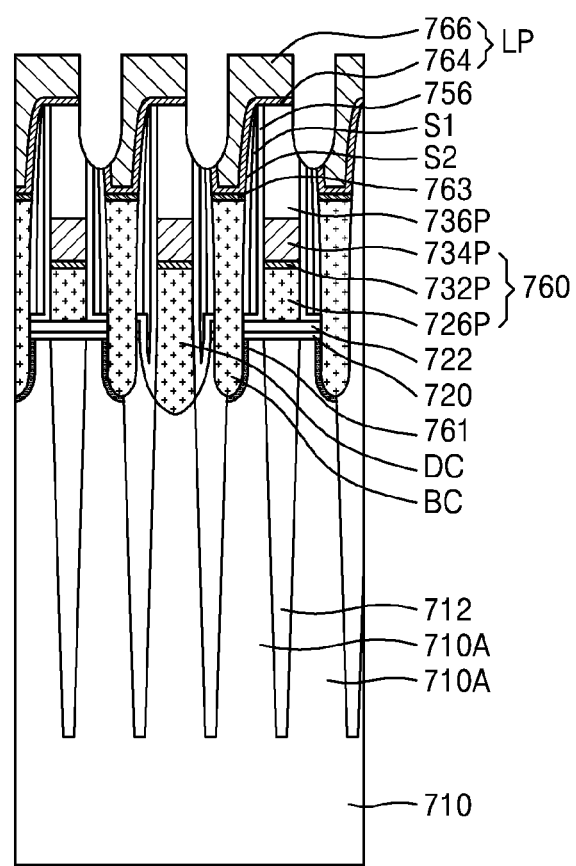

Referring to FIG. 23K, the plurality of buried contacts BC (see FIG. 22) and a plurality of conductive landing pads LP that are connected to the plurality of buried contacts BC are formed in a space between the plurality of bit lines 760 in a resultant structure of FIG. 23J.

In detail, insulating spacers S1 and S2 that cover the insulating liner 756 are formed on side walls of each of the plurality of bit lines 760, a plurality of insulating patterns (not shown in FIG. 23K) that define a plurality of holes for forming the buried contacts BC (see FIG. 22) in a space between the plurality of bit lines 760 are formed, the active regions 710A of the substrate 710 are exposed through the plurality of holes, and a metal silicide film 761 is formed on a surface of each of the exposed active regions 710A. Thereafter, the plurality of buried contacts BC that are respectively connected to the active regions 710A are formed by filling a conductive layer in lower portions of the plurality of holes.

In some exemplary embodiments, the metal silicide film 761 may be formed of cobalt silicide. However, the metal silicide film 761 is not limited thereto, and may be formed of any of various metal silicide materials. In some exemplary embodiments, the plurality of buried contacts BC may be formed of doped polysilicon. In some exemplary embodiments, the metal silicide film 761 may be omitted.

In some exemplary embodiments, the insulating spacers S1 and S2 may be formed of a silicon oxide film, a silicon nitride film, air, or a combination thereof. Although the insulating spacers S1 and S2 have a double-layer structure, the present exemplary embodiment is not limited thereto and the insulating spacers S1 and S2 may have a single- or three-layer structure. The plurality of insulating patterns may be formed of a nitride film, an oxide film, or a combination thereof.

Thereafter, a metal silicide film 763 is formed on the plurality of buried contacts BC in the plurality of holes between the plurality of bit lines 760. In some exemplary embodiments, the metal silicide film 763 may be formed of cobalt silicide. However, the metal silicide film 763 is not limited thereto, and may be formed of any of various metal silicide materials. In other exemplary embodiments, the metal silicide film 763 may be omitted.

Thereafter, a conductive barrier film and a conductive layer are formed, and the conductive barrier film and the conductive layer are etched back to expose the insulating liner 756. As a result, a part of the conductive barrier film and a part of the conductive layer may remain as a conductive barrier film 764 and a conductive layer 766 that are formed on the metal silicide film 763 to cover the plurality of bit lines 760 and fill the plurality of holes.

In some exemplary embodiments, the conductive barrier film 764 may have a Ti/TiN stacked structure. In some exemplary embodiments, the conductive layer 766 may be formed of doped polysilicon, metal, metal silicide, conductive metal nitride, or a combination thereof.

Thereafter, in a cell array region, a mask pattern (not shown) that exposes a part of the conductive layer 766 is formed on the conductive layer 766, the conductive barrier film 764, the conductive layer 766, and insulating films that are formed around the conductive barrier film 764 and the conductive layer 766 are etched by using the mask pattern as an etch mask, and a plurality of landing pads LP including remaining portions of the conductive barrier film 764 and the conductive layer 766 are formed.

The plurality of landing pads LP may have a plurality of island-shaped patterns that are spaced apart from one another, like the plurality of buried contacts BC of FIG. 18.

A photolithography process may be used in order to form the plurality of landing pads LP. In this case, in order to form the plurality of landing pads LP, any of the methods of forming a pattern of FIGS. 1A through 18O may be used.

Figure 23L:
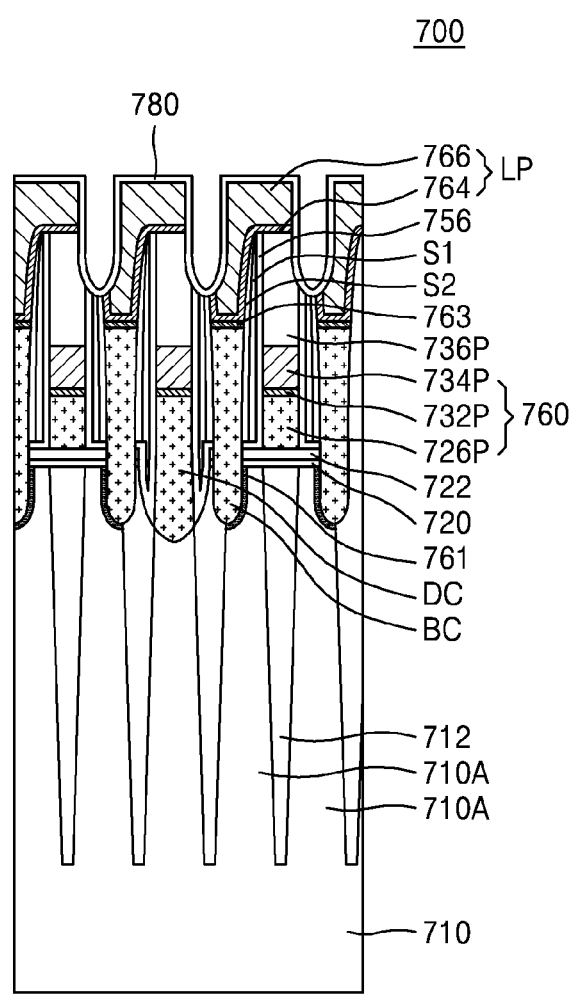

Referring to FIG. 23L, an insulating thin film 780 is formed on a top surface of a resultant structure including the plurality of conductive landing pads LP. The insulating thin film 780 may be, but is not limited to, a nitride film.

Thereafter, the integrated circuit device 700 may be formed by forming an insulating film on the insulating thin film 780 and forming a plurality of lower electrodes of capacitors that may be electrically connected to the plurality of conductive landing pads LP in the cell array region. The lower electrodes may correspond to the lower electrodes ST of FIG. 22.

Figure 24:
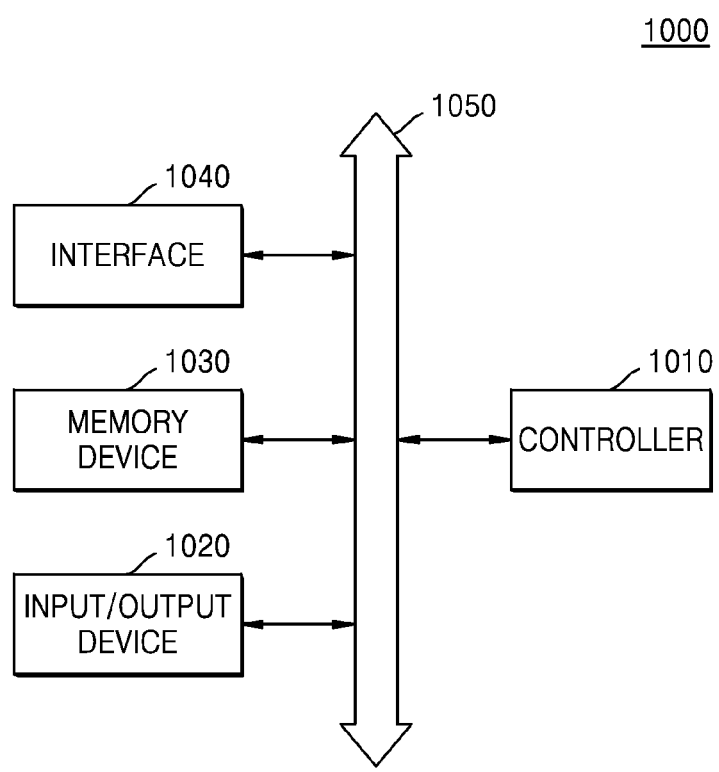
FIG. 24 is a block diagram illustrating a system including an IC device, according to an exemplary embodiment.

FIG. 24 is a block diagram illustrating a system 1000 including an integrated circuit device, according to an exemplary embodiment.

The system 1000 includes a controller 1010, an input/output device 1020, a memory device 1030, and an interface 1040. The system 1000 may be a mobile system or a system that transmits or receives information. In some exemplary embodiments, the mobile system may be a personal digital assistant (PDA), a portable computer, a web tablet, a wireless phone, a mobile phone, a digital music player, or a memory card. The controller 1010 for controlling a program executed in the system 1000 may include a microprocessor, a digital signal processor, a microcontroller, or the like. The input/output device 1020 may be used to input or output data of the system 1000. The system 1000 may be connected to an external device such as a personal computer or a network by using the input/output device 1020, and may exchange data with the external device. The input/output device 1020 may be, for example, a keypad, a keyboard, or a display device.

The memory device 1030 may store code and/or data for operating the controller 1010, or may store data processed by the controller 1010. The memory device 1030 includes at least one integrated circuit obtained by using a method of forming a pattern or a method of manufacturing an integrated circuit device of the previous exemplary embodiments. For example, the memory device 1030 includes at least one integrated circuit device obtained by using any one from among the methods of forming a pattern of FIG. 1A through 18O or any one from among the methods of manufacturing an integrated circuit device of FIGS. 22 through 23L.

The interface 1040 may be a transmission path through which data is transmitted between the system 1000 and the external device. The controller 1010, the input/output device 1020, the memory device 1030, and the interface 1040 may communicate with one another via a bus 1050. The system 1000 may be used in a mobile phone, an MP3 player, a navigation system, a portable multimedia player (PMP), a solid-state disc (SSD), or a household appliance.

Figure 25:
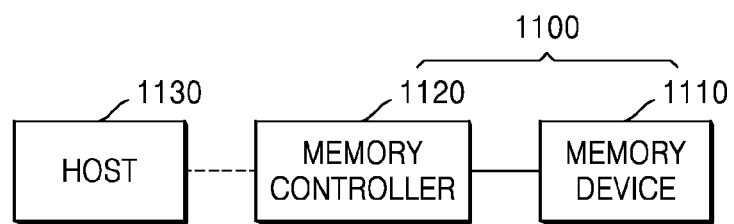
FIG. 25 is a block diagram illustrating a memory card including an IC device, according to an exemplary embodiment.

FIG. 25 is a block diagram illustrating a memory card 1100 including an integrated circuit device, according to an exemplary embodiment.

The memory card 1100 includes a memory device 1110 and a memory controller 1120.

The memory device 1110 may store data. In some exemplary embodiments, the storage unit 11110 may be nonvolatile and thus it may retain stored data even when powered off. The memory device 1110 includes at least one integrated circuit device obtained by using a method of forming a pattern or a method of manufacturing an integrated circuit device according to the previous exemplary embodiments. For example, the memory device 1110 includes at least one integrated circuit device obtained by using any one from among the methods of forming a pattern of FIGS. 1A through 18O and any one from among the methods of manufacturing an integrated circuit device of FIGS. 22 through 23L.

The memory controller 1120 may read data stored in the memory device 1110 or may store data in the memory device 1110 in response to a read/write request of a host 1130. The memory controller 1120 includes at least one integrated circuit device obtained by using any method of the previous exemplary embodiments. For example, the memory controller 1120 includes at least one integrated circuit device obtained by using any one from among the methods of forming a pattern of FIG. 1A through 18O or any one from among the methods of manufacturing an integrated circuit device of FIGS. 22 through 23L.

While the inventive concept has been particularly shown and described with reference to exemplary embodiments thereof, it will be understood that various changes in form and details may be made therein without departing from the spirit and scope of the following claims.

What is claimed is:

1. A method of forming a fine pattern, the method comprising:
    forming on a feature layer on a substrate a plurality of first holes that are regularly arranged to have a first pitch;
    forming a plurality of pillar-shaped guides that fill the plurality of first holes and protrude upward beyond the feature layer;
    forming a major block affinity liner covering a side wall of each of the plurality of pillar-shaped guides;
    forming a neutral liner on a local region of the feature layer disposed between the plurality of pillar-shaped guides;
    forming a block copolymer layer comprising a first polymer block having a first repeating unit and a second polymer block having a second repeating unit around the plurality of pillar-shaped guides on the neutral liner;
    phase separating the block copolymer layer, and forming a plurality of first domains that comprise the first polymer block, disposed in a first location spaced apart from the major block affinity liner on the neutral liner, and are regularly arranged along with the plurality of pillar-shaped guides and a second domain that comprises the second polymer block and surrounds the plurality of pillar-shaped guides and the plurality of first domains;
    removing the plurality of first domains; and
    forming a plurality of second holes in the feature layer by etching the neutral liner and the feature layer by using the plurality of pillar-shaped guides and the second domain as etch masks.

2. The method of claim 1, wherein the block affinity liner comprises a polymer having the second repeating unit as a main component, and wherein the neutral liner comprises a random copolymer as a main component, the random copolymer comprising a first polymer having the first repeating unit and a second polymer having the second repeating unit.

3. The method of claim 1, wherein the block affinity liner comprises polystyrene (PS), and the neutral liner comprises a random copolymer of PS and one selected from poly (methyl methacrylate) (PMMA), poly (ethylene oxide) (PEO), poly (lactic acid) (PLA), and polyisoprene (P1).

4. The method of claim 1, wherein forming the block affinity liner comprises:
    forming a neutral blanket liner extending to cover exposed surfaces of the plurality of pillar-shaped guides and the local region of the feature layer and comprising a material having a higher affinity for the second polymer block than for the first polymer block; and
    exposing the local region of the feature layer by removing a part of the neutral blanket liner.

5. The method of claim 1, wherein forming the plurality of pillar-shaped guides comprises:
    before forming the plurality of first holes in the feature layer, forming on the feature layer a plurality of pillar-shaped guide outer walls that define inner spaces through which the feature layer is exposed and have widths greater than widths of the plurality of first holes; and
    after forming the plurality of first holes in the feature layer, forming a plurality of pillar cores comprising lower portions that fill the plurality of first holes and extending portions that fill the inner spaces and protrude upward beyond the feature layer.

6. The method of claim 1, wherein forming the plurality of first holes comprises forming the plurality of first holes so that the plurality of first holes are arranged in a hexagonal array to have a first pitch that is at least 1.5 times a bulk period of the block copolymer layer, wherein the bulk period of the block copolymer layer ranges from about 40 nm to about 60 nm.

7. The method of claim 1, wherein forming the plurality of first holes comprises forming the plurality of first holes so that the plurality of first holes are regularly arranged to have a first pitch, and the phase separating of the block copolymer layer comprises phase separating the block copolymer layer so that the plurality of first domains are arranged in a cylindrical shape at a central portion between two or three first holes that are adjacent to each other from among the plurality of first holes, and the plurality of first holes and the plurality of first domains are regularly arranged to have a second pitch that is less than the first pitch.

* * * * *